United States Patent
Park et al.

(10) Patent No.: US 6,326,286 B1
(45) Date of Patent: Dec. 4, 2001

(54) METHOD FOR CRYSTALLIZING AMORPHOUS SILICON LAYER

(75) Inventors: Won-Kyu Park, Songnam-shi; Yun-Ho Jung; Se-Jin Chung, both of Seoul, all of (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/311,700

(22) Filed: May 13, 1999

(30) Foreign Application Priority Data

Jun. 9, 1998 (JP) .................................................. 98-21290
Jun. 9, 1998 (JP) .................................................. 98-21291

(51) Int. Cl.$^7$ .................................................. H01L 21/20

(52) U.S. Cl. ........................................... 438/478; 438/486
(58) Field of Search ............................... 438/30, 149–158, 438/166, 486, 795

(56) References Cited

U.S. PATENT DOCUMENTS

| | | |
|---|---|---|
| 5,432,122 | 7/1995 | Chae . |
| 5,496,768 | 3/1996 | Kudo . |
| 5,767,003 | 6/1998 | Noguchi . |
| 5,817,548 | 10/1998 | Noguchi et al. . |
| 5,858,807 | * 1/1999 | Kawamura et al. .................. 438/30 |

FOREIGN PATENT DOCUMENTS

| | | |
|---|---|---|
| 0 141 506 | 5/1985 | (EP) . |
| 0 178 447 | 4/1986 | (EP) . |
| 0 456 199 | 11/1991 | (EP) . |
| 7-99314 | 4/1995 | (JP) . |
| 9-260684 | 10/1997 | (JP) . |
| 97/45827 | 12/1997 | (WO) . |
| WO 97/45827 | 12/1997 | (WO) . |

OTHER PUBLICATIONS

J.P. Leonard, et al., *The Effect of Film Thickness and Pulse Duration Variation in Excimer Laser Crystallization of Thin Si Films*, Mat. Res. Soc, Symp. Proc. vol. 452, pp. 947–952, 1997.

R.S. Sposili, et al., *Single–Crystal Si Films Via a Low–Substrate–Temperature Excimer–Laser Crystallization Method*, Mat. Res. Soc. Symp. Proc. vol. 452, pp. 953–958, 1997.

J.S. Im, et al., *Single–Crystal Si Films for Thin–film Transistor Devices*, Appl. Phys. Lett. 70(25), pp. 3434–3436, Jun. 23, 1997.

(List continued on next page.)

*Primary Examiner*—David Nelms
*Assistant Examiner*—Dung A Le
(74) *Attorney, Agent, or Firm*—Long Aldridge & Norman LLP

(57) ABSTRACT

An active layer commonly used in a thin-film-transistor is made by irradiating an amorphous silicon layer with a laser source at an energy density sufficient to induce substantially complete melting to form a melted region and an unmelted region. The melted region of the amorphous silicon layer is solidified with a lateral grain growth from the unmelted region to the melted region. Then the amorphous silicon layer is translated relative to the laser source. In such an apparatus, the laser source is prepared by emitting a laser beam through a mask. The mask has a plurality of transparent regions which comprises slits arranged adjacent to or next to each other and separated by a predetermined distance in certain applications. Such pattern includes contiguous chevron-shaped lines with curved apexes. Alternatively, the pattern also includes slim rectangular apertures.

23 Claims, 24 Drawing Sheets

FIRST IRRADIATED REGION

SECOND IRRADIATED REGION
FIRST IRRADIATED REGION

OTHER PUBLICATIONS

M.A. Crowder, et al., *Low–Temperature Single–Crystal Si TFTs Fabricated on Si Films Processed Via Sequential Lateral Solidification*, IEEE Electron Device Letters, pp. 1–3, Sep. 1997.

J.S. Im, et al., *Controlled Super–Lateral Growth of Si Films for Microstructural Manipulation and Optimization*, Physics Status Solid, pp. 1–7 w/8 pages of figures, Feb. 22, 1998.

James S. Im, et al., *Crystalline Si Films for Integrated Active–Matrix Liquid–Crystal Displays*, MRS Bulletin, Mar. 1996, pp. 39–48.

James S. Im, et al., *Single Crystal Silicon Films Via a Low–Substrate–Temperature Excimer–Laser Crystallization Method*, MRS Abstract 1996 Fall Meeting.

* cited by examiner

FIRST IRRADIATED REGION

SECOND IRRADIATED REGION
FIRST IRRADIATED REGION

FIRST IRRADIATED REGION

SECOND IRRADIATED REGION

FIRST IRRADIATED REGION

FIRST TIME IRRADIATED

SECOND TIME IRRADIATED

THIRD TIME IRRADIATED

FOURTH TIME IRRADIATED

FIG.25

| G | G | G | G | G | G |
|---|---|---|---|---|---|
| G | G | G | G | G | G |
| G | G | G | G | G | G |

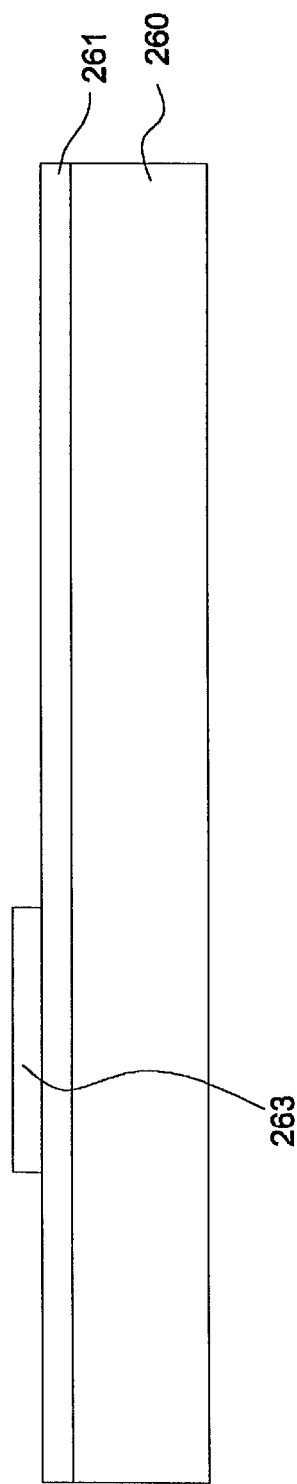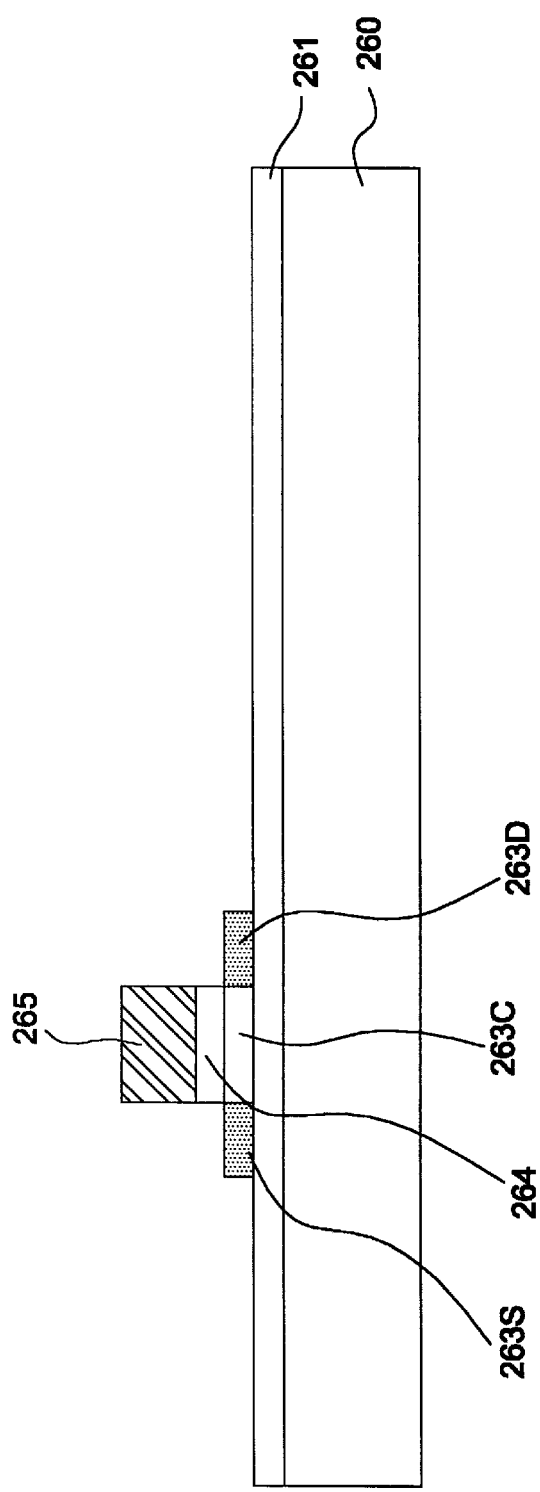

METHOD FOR CRYSTALLIZING AMORPHOUS SILICON LAYER

BACKGROUND OF THE INVENTION

1. Field of Invention

The present invention relates to a method for crystallizing an amorphous silicon layer and a method for fabricating a thin film transistor (TFT) using the same, and more particularly, a method for crystallizing an amorphous silicon layer and fabricating a TFT by utilizing the Sequential Lateral Solidification (SLS) technique.

2. Discussion of the Related Art

In order to fabricate TFTs on a low heat-resistant substrate, such as a glass substrate, an amorphous silicon layer or a polycrystalline silicon layer is deposited on the substrate and etched by photolithography to form active layers for TFTs.

The mobility of charge carriers is low in the amorphous silicon layer. Accordingly, amorphous silicon TFT is not typically used as a driving circuit or a controller of a liquid crystal display (LCD). However, the mobility of charge carriers is high in the polycrystalline layer. Accordingly, polycrystalline TFTs can be used in driving circuits of a liquid crystal display (LCD), wherein devices for pixel array and driving circuits are formed simultaneously.

There are two techniques for forming polycrystalline silicon film on a glass substrate. In the first technique, an amorphous silicon film is deposited on the substrate and crystallized at a temperature of about 600° C. by Solid Phase Crystallization (SPC). This technique is difficult and problematic in terms of cost and materials because it requires a very high temperature.

The second technique involves depositing an amorphous silicon film on the substrate and crystallizing the film by thermal treatment using a laser. The second technique is not a high temperature process, thus, this facilitates the formation of a polycrystalline silicon film on the glass substrate.

FIGS. 1A to 1D are schematic drawings which illustrate a method for forming a polycrystalline silicon film according to one related art. Referring to FIG. 1A, a particular region of an amorphous silicon film 10 is first irradiated at an energy density to induce formation of separated islands of amorphous silicon 11a and the liquid silicon region 11L, a region generated by the irradiation of a laser beam, completely melts.

Referring to FIG. 1B, the amorphous film is translated relative to the laser beam over a distance less than the predetermined distance for a second irradiation. While the film is translating, the liquid silicon region 11L is crystallized under low temperature through a cooling process. The separated islands of amorphous silicon 11a are used as seeds for the crystallization process which results in the growth of the liquid silicon region 11L, thereby forming a first polycrystalline silicon region 11P. Grain growth occurs not only in the middle of the growth region, but growth also occurs in the interface between the liquid silicon region 11L and solid state amorphous silicon region a-Si. The grain growth stops when the grains collide at these grain boundaries.

Referring to FIG. 1C, a selected region of a translated amorphous silicon film is secondly irradiated. Thus, separated islands of amorphous silicon 12a remain and the other portions of the silicon, namely, silicon region 12L completely melts.

In FIG. 1D, the amorphous film is translated relative to the laser beam for the next irradiation. While the film is translating, the liquid silicon region 12L is crystallized under a low temperature cooling process. The separated islands of amorphous silicon 12a are used as seeds which grow into the liquid silicon region 12L, thereby forming a second polycrystalline silicon region 12P. Moreover, grain growth occurs at the interface between the liquid silicon region 12L and solid state amorphous silicon region a-Si, as well as at the interface between the liquid silicon region 12L and the first polycrystalline silicon region 11P.

The above described processes of irradiating and crystallizing are repeated over a total translation distance in order to crystallize the entire film. However, since the size of each silicon grain is not uniform and the location of the grain boundary varies in the polycrystalline silicon layer, a device-to-device uniformity is degraded in TFTs fabricated by such methods.

Accordingly, it is desirable and necessary to make the location of the grain boundary uniform and the grain size large.

Accordingly, it is proposed that a polycrystalline silicon film be formed on the glass substrate by using Sequential Lateral Solidification (SLS) techniques, as described in Robert S. Sposilli, M. A. Crowder, and James S. Im, Mat. Res. Soc. Symp. Proc. Vol. 452, 956–957, 1997. The SLS technique uses a phenomenon wherein the grain boundaries in directionally solidified materials tend to form perpendicularly to the melted interface. The SLS technique enables the conversion of as-deposited amorphous or polycrystalline silicon films into a directionally solidified microstructure consisting of long, columnar grains.

The laser beam pattern for using SLS technique is prepared by an annealing apparatus as shown in FIG. 2. An unpatterned laser beam is emitted from a light source 20 and is passed through an attenuator 22 to control the energy density of the unpatterned laser beam. The unpatterned laser beam is focused on a focus lens 22 and passed through a mask having a predetermined pattern 23 in order to pattern the laser beam. The patterned laser beam then passes through an imaging lens 24. A film 29 on a translation stage 25 is irradiated by the patterned laser beam. The entire film is scanned by the laser beam at a predetermined repetition rate. In this regard, Mirrors 28-1, 28-2, and 28-3 control the path of the laser beam.

FIGS. 3A to 3C show a method for crystallizing an amorphous silicon film by the SLS technique according to another related art. Referring to FIG. 3A, a narrow region having a slit film shape, bounded by the dashed lines 42 and 43, is irradiated at an energy density sufficient to induce complete melting. Subsequently, lateral grain growth proceeds from the unmelted regions to the adjacent narrow strip region 41 which is fully-melted. Grain boundaries in directionally solidified materials proceed perpendicularly to the melt interface. Depending on the width of the molten region, lateral growth ceases when either of two events occur: (1) the two opposing growth fronts collide at the center, or (2) the molten region becomes sufficiently supercooled to cause bulk nucleation of solids.

Due to these restrictive events, the maximum lateral growth distance which can be achieved with a single pulse is limited depending on the film thickness and the incident energy density.

Referring to FIG. 3B, the film is translated relative to the beam image over a distance less than the single-pulse lateral growth distance and irradiated again. Lateral growth begins again from the edges of the completely molten region, located within the grains grown during the previous irradiation step. The length of the grains is increased beyond the single-pulse lateral growth distance. For example, a narrow region 45 bounded by dashed lines 46 and 47 is irradiated by a second laser pulse. Since one of these edges, in this case the edge 46, is located within the silicon region grown during the previous irradiation step, the lengths of the silicon grains formed by the previous irradiation are extended by the second irradiation beyond the single-phase lateral growth distance.

Referring to FIG. 3C, the above-described processes of irradiation and solidification can be repeated indefinitely, creating grains of any desired length. The final resultant microstructure is shown.

Using the method of the related art, a polycrystalline silicon film having uniform physical characteristics could be achieved through lateral growth of the silicon grain. However, the polycrystalline silicon film cannot be used to form devices for complicated circuits, whereas a single crystal silicon film may be use in the manufacture of such devices.

FIGS. 4A to 4C illustrate a method for crystallizing an amorphous silicon film using the SLS technique according to a third related art. Referring to FIG. 4A, a selected region having a chevron-shaped aperture of the film and bounded by the dashed lines is irradiated at an energy density sufficient to induce complete melting. Subsequently, lateral grain growth proceeds from the unmelted region to the adjacent narrow strip, fully-melted region. The grain boundaries in directionally solidified materials tend to form perpendicularly in relation to the melt interface.

Because of the above-noted considerations, the maximum lateral growth distance that can be achieved with a single pulse is limited depending on the film thickness and the incident energy density. More specifically, the grain formed at the apex of the chevron experiences lateral growth not only in the translation direction, but also transverse to it, because the grain boundaries are formed perpendicularly to the melt interface. Therefore, the negative curvature of the molten zone at the apex of the chevron leads to a widening of the grain, such that a single crystal silicon grain region is induced.

Referring to FIG. 4B, the film is translated relative to the beam image over a distance which is approximately one-half of the single-pulse lateral growth distance, and irradiated again. Lateral growth recommences from the edges of the completely molten region, located within the grains grown during the previous irradiation step. The length of the grains is increased beyond the single-pulse lateral growth distance. The grain formed at the apex of the chevron, a single crystal silicon region, widens.

As shown in FIG. 4C, the above-cited processes of irradiation and solidification can be repeated indefinitely, resulting in grains of any desired length. The final resultant microstructure is illustrated. As shown in FIG. 4C, the grain formed at the apex of the chevron, a single crystal silicon region, widens dramatically.

FIG. 5 shows TEM data, indicating a crystalline silicon film crystallized by using the chevron-shaped laser beam. This drawing shows a polycrystalline silicon region, having lateral columnar silicon grains grown perpendicular to the interface between the amorphous silicon region and the irradiated silicon region, and a single crystalline region formed from the apex of the chevron to its upper portion.

However, defects in the sub-boundaries areas can be found in the single crystalline region. Therefore, the crystallized silicon films formed by using a chevron-shaped laser beam do not yield TFT devices which can achieve the level of performance of silicon wafer-based TFT devices.

FIG. 6 shows the distribution of the energy density of an irradiated silicon film portion by a chevron-shaped laser beam. The energy density of the other portions, except the apex portion of the chevron-shaped beam, shows a normal distribution, the brim of which is low and the center is high. But the energy density of the apex portion 51 of the chevron-shaped film is low relative the other portion which surrounds it. The explanation lies in the fact that the interference of the laser beam occurs at the apex because of the characteristics of the chevron-shaped beam. Thus, differences of the thermal stress can form in the molten silicon portion irradiated by the apex of the laser beam. The principal defect lies in the interior of the crystallized silicon.

SUMMARY OF THE INVENTION

Accordingly, the present invention is directed to a method for crystallizing an amorphous silicon layer and a method for fabricating a TFT using the same, that substantially obviates one or more of the problems due to limitations and disadvantages of the related art.

Another object of the present invention is to provide a method for crystallizing an amorphous silicon layer and a method for fabricating a TFT using the same, so that the size of the silicon grain grows dramatically.

Another object of the present invention is to provide a method for crystallizing an amorphous silicon layer and a method for fabricating a TFT using the same, by forming a single crystalline silicon region on the glass substrate through a crystallization method that uses the SLS technique and improves the pattern of the laser beam.

Another object of the present invention is to provide a method for crystallizing an amorphous silicon layer and a method for fabricating a TFT using the same, by using a plurality of laser beams to crystallize a large area of the substrate in a relatively short period of time.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention comprises the steps of preparing an amorphous silicon layer which will be crystallized on the insulating substrate; preparing a laser beam having a chevron-shape, the apex of which is round; first irradiating a selected portion of the amorphous silicon layer with the laser beam at an energy density sufficient to induce complete melting; solidifying the melted region of the amorphous silicon layer by proceeding a lateral grain growth from the unmelted regions to the melted regions; translating the amorphous layer relative to the beam image over a first distance to a first direction; and second-irradiating a selected portion of the amorphous silicon layer with the laser beam and crystallizing the irradiated portions of the amorphous silicon layer.

Another aspect of the present invention comprises steps of preparing an amorphous silicon layer which will be crystallized on the insulating substrate; preparing a plurality of laser beams, arrayed at a predetermined distance between the laser beams, each laser beam having a first directional straight line shape; first-irradiating a plurality of the selected portions of the amorphous silicon layer with the laser beams at an energy density sufficient to induce complete melting; solidifying the melted region of the amorphous silicon layer by proceeding a lateral grain growth from the unmelted regions to the melted regions; translating the amorphous layer relative to the beam image over a first distance to a second direction; and second-irradiating a plurality of the selected portions of the amorphous silicon layer with the laser beams at an energy density sufficient to induce complete melting and crystallizing the irradiated portions of the amorphous silicon layer.

Another aspect of the present invention comprises steps of preparing a mask having a plurality of opaque regions of the dot shape, arrayed at a predetermined distance between dot shape to dot shape in a transparent region substrate; preparing an amorphous silicon layer which will be crystallized on the insulating substrate; first-irradiating a selected region of the amorphous silicon layer with a laser beam at an energy density sufficient to induce complete melting, the laser beam being prepared by making an unpatterned laser beam pass through the mask; solidifying the melted region of the amorphous silicon layer by proceeding a lateral grain growth from the unmelted regions to the melted regions; translating the amorphous layer relative to the beam image over a distance less than the single-pulse lateral growth distance in a predetermined direction; second-irradiating a selected region of the silicon layer with a laser beam at an energy density sufficient to induce complete melting; solidifying the melted region of the silicon layer by proceeding a lateral grain growth from the unmelted regions to the melted region; and translating the silicon layer relative to the beam image over a distance less than the single-pulse lateral growth distance in a predetermined direction.

Another aspect of the present invention comprises an active layer, a gate insulating layer and a gate electrode, the forming method of the active layer comprising the steps of: depositing an amorphous silicon layer on an insulating material layer; crystallizing the amorphous silicon layer with a laser beam by Sequential Lateral Solidification technique, the laser beam having a chevron-shaped aperture, the apex of which is round; and etching the amorphous silicon layer to pattern the active layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide further understanding of the invention and are incorporated in and constitute part of this application, illustrate the embodiments of the invention, and together with the description, serve to explain the principles of the present invention.

FIG. 25 is a drawing showing crystallization according to the eleventh embodiment of the present invention; and FIGS. 26A to 26E are schematic drawings showing a method for fabricating a TFT according to an embodiment of the present invention.

DETAILED DESCRIPTION OF THE PREFERRED EMBODIMENTS

Hereinafter, the preferred embodiments of the present invention will be described in detail, examples of which are illustrated in the accompanying drawings.

Figure 1A:
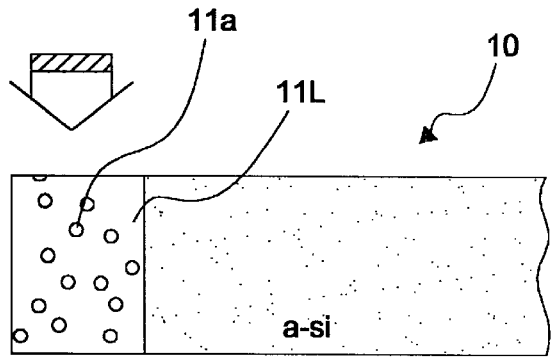
FIGS. 1A to 1D are schematic drawings showing a method for crystallizing a silicon layer according to a related art.
Figure 1B:
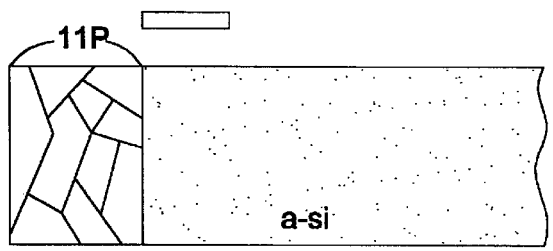
Figure 1C:
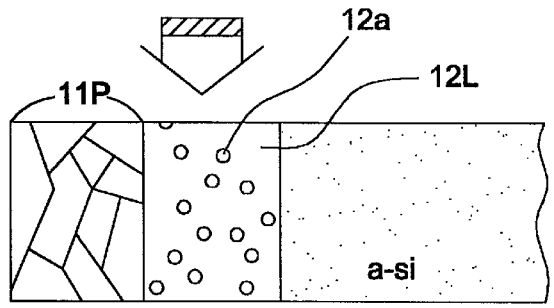
Figure 1D:
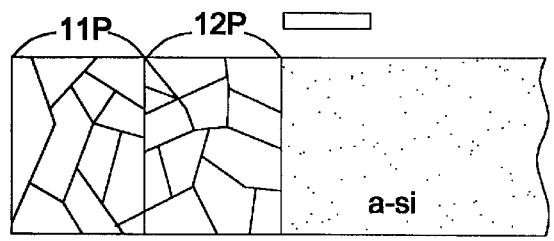
Figure 2:
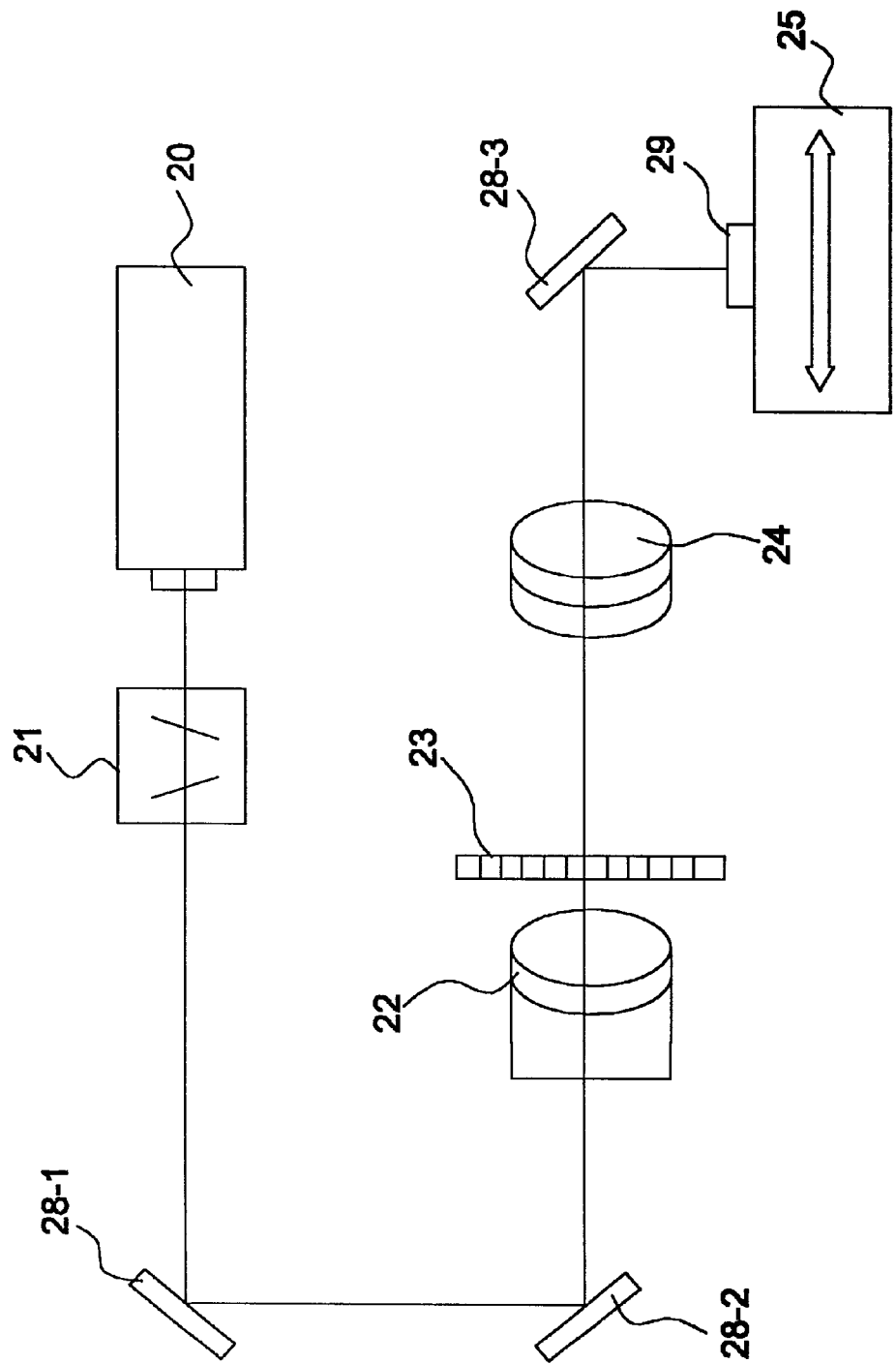
FIG. 2 is a schematic drawing showing a laser annealing system for the SLS technique.
Figure 3A:
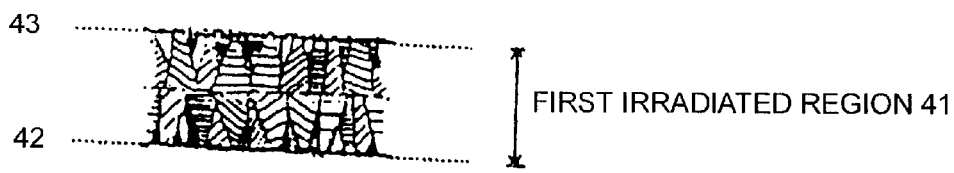
FIGS. 3A to 3C are schematic drawings illustrating a method for crystallizing a silicon layer according to a related art.
Figure 3B:
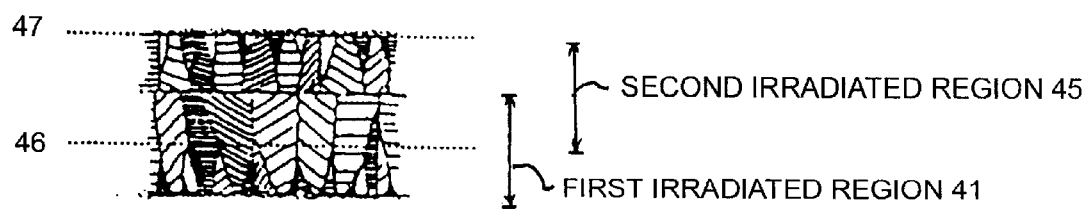
Figure 3C:
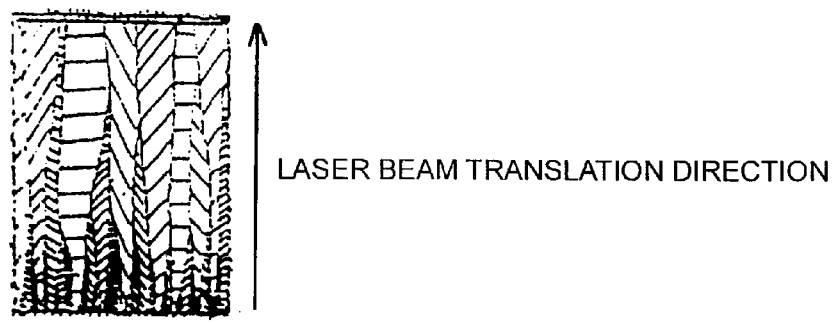
Figure 4A:
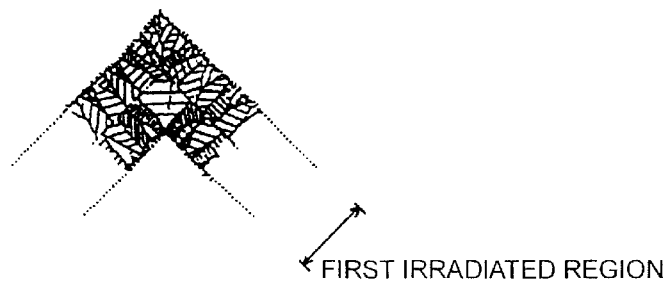
FIGS. 4A to 4C are schematic drawings showing a method for crystallizing a silicon layer according to a related art.
Figure 4B:
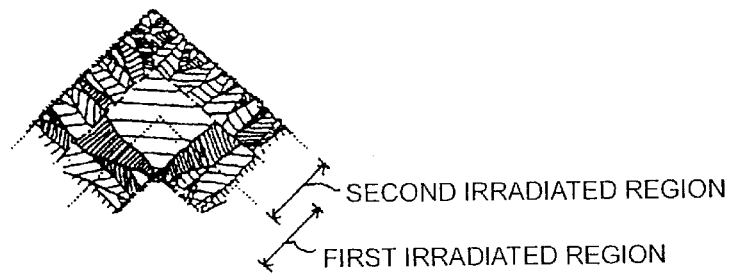
Figure 4C:
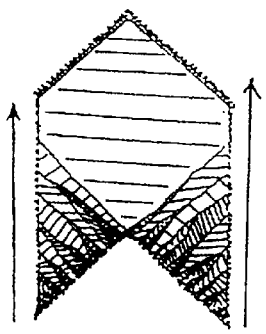
Figure 5:
FIG. 5 is a TEM showing the crystallization according to the related art.
Figure 6:
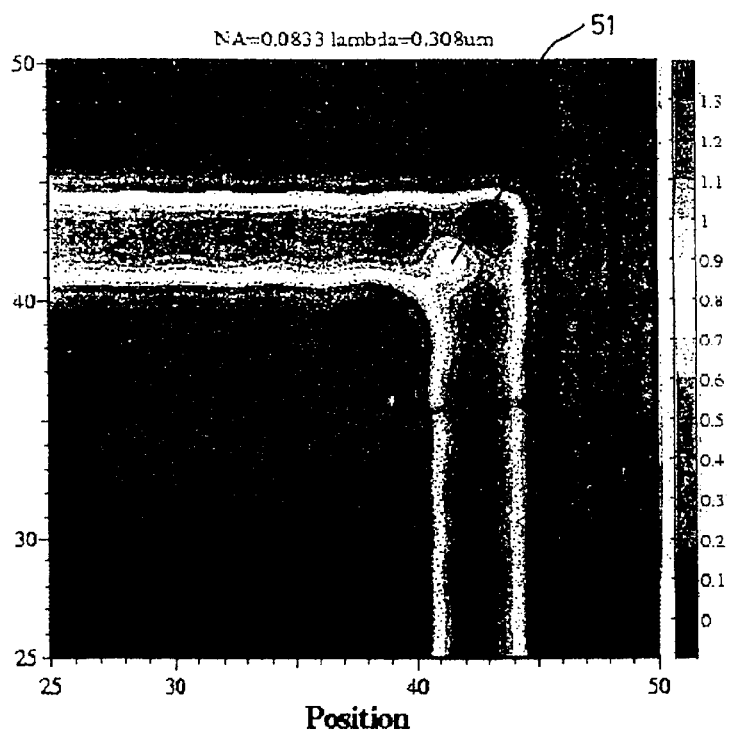
FIG. 6 is a drawing showing the thermal distribution of the laser beam according to the related art.
Figure 7A:
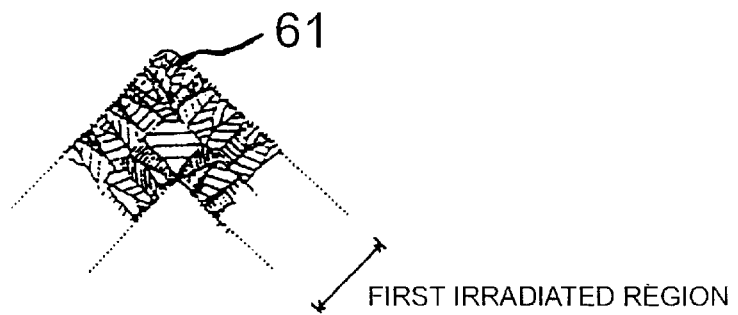
FIGS. 7A to 7C are schematic drawings for illustrating a method for crystallizing a silicon layer according to a first embodiment of the present invention.
Figure 7B:
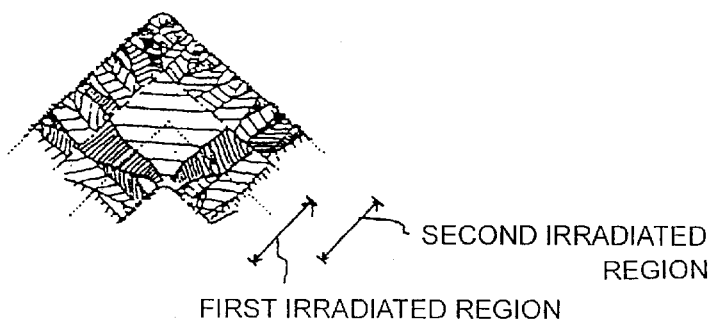
Figure 7C:
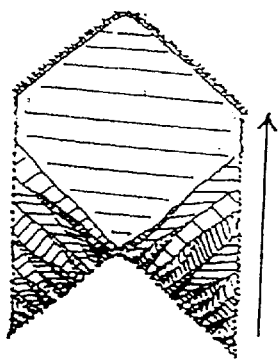

FIGS. 7A to 7C are schematic drawings showing a method for crystallizing an amorphous silicon film using the SLS technique according to a first embodiment of the present invention, wherein an amorphous silicon film is crystallized by using a chevron-typed laser beam having a round apex.

Referring to FIG. 7A, a selected film region, having chevron-shaped apertures and a rounded apex 61, and bounded by the dashed lines, is irradiated at an energy density sufficient to induce complete melting. Subsequently, lateral grain growth proceeds from the unmelted regions adjacent to the narrow strip, fully-melted region. The grain boundaries in directionally solidified materials tend to form so as to always be approximately perpendicular to the melt interface. Due to such considerations, the maximum lateral growth distance that can be achieved with a single pulse is limited, depending on the film thickness and the incident energy density. Here, the grain formed at the apex of the chevron experiences lateral growth not only in the translation direction, but also transversely, because grain boundaries form perpendicularly to the melt interface. Thus, the negative curvature of the molten zone at the apex of the chevron leads to widening of the grain, so that a single crystal silicon grain region is induced.

The size of the single crystalline region is determined by the width of the beam pattern and the distance of the translation of the film. The location of the single crystalline region may be accurately controlled by using a laser beam which provides an appropriate pattern.

Figure 8:
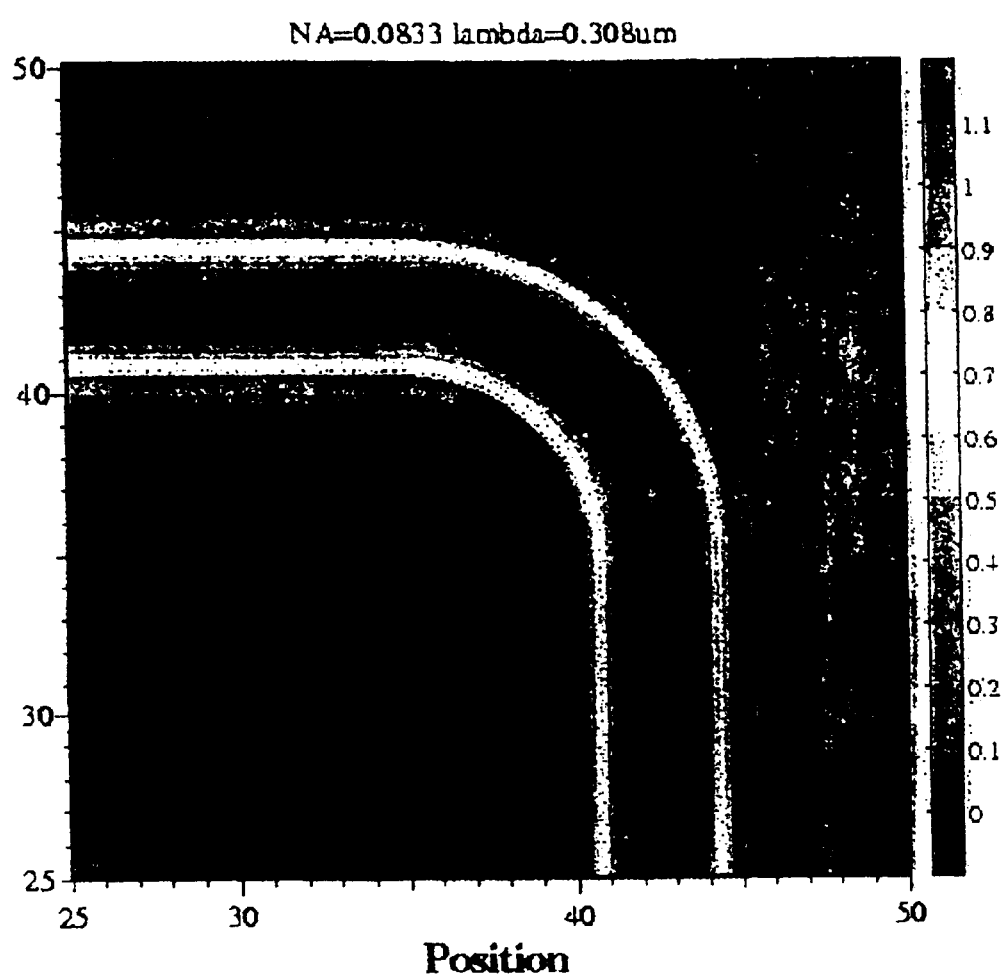
FIG. 8 is a TEM showing crystallization according to the first embodiment of the present invention.

The difference of the thermal stress is reduced in the molten silicon portion irradiated by the rounded apex 61 of the laser beam. FIG. 8 shows the distribution of the energy density of an irradiated silicon portion by a chevron-shaped laser beam having a rounded apex 61.

In particular, the entire portion of the energy density of the chevron-shaped film having a rounded apex has a normal energy distribution, of which the brim is low but is higher to the center. Accordingly, the difference of the thermal stress is not present in the molten silicon portion irradiated by the rounded apex of the laser beam. As a result, the interference of the laser beam in the apex is substantially reduced. Since the difference of the thermal stress is not formed or at least reduced in the molten silicon portion, the principal defect—the difference of the thermal stress, such as the sub-boundaries as above described—is not formed in the interior of the crystallized silicon.

Referring to FIG. 7B, the film is translated relative to the beam image over a distance of less than the single-pulse lateral growth distance, approximately one-half of this distance, and irradiated again. The lateral growth recommences from the edges of the completely molten region, one of which is located within the grains grown during the previous irradiation step. The length of the grains increases beyond the single-pulse lateral growth distance, and the grain formed at the apex of the chevron, namely, a single crystal silicon region, widens.

Referring to FIG. 7C, the above-cited process of irradiation and solidification, is repeated indefinitely, resulting in grains of any desired length. The final resultant microstructure is shown. The grain formed at the apex of the chevron, namely, the single crystal silicon region is widened dramatically.

Figure 9:
FIG. 9 is a drawing showing thermal distribution of the laser beam according to the first embodiment of the present invention.

FIG. 9 shows a TEM drawing, showing a crystalline silicon film crystallized according to the first embodiment of the present invention. This figure shows a polycrystalline silicon region, having lateral columnar silicon grains grown perpendicular to the interface between the amorphous silicon region and the irradiated silicon region, and a single crystalline region formed from the rounded apex of the chevron to its upper portion. A pure single crystalline region without sub-boundaries is shown.

Figure 10:
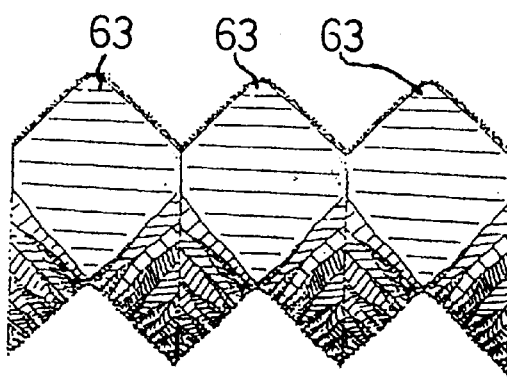
FIG. 10 is a drawing showing crystallization according to a second embodiment of the present invention.

FIG. 10 is a schematic drawing depicting a method for crystallizing a silicon film according to a second embodiment of the present invention. This embodiment uses a laser beam having a continuous chevron-shape having rounded apexes 63. FIG. 10 shows the crystallization using the above laser beam.

The method for crystallizing the silicon film through the SLS technique by using the laser beam having the rounded apex is described previously. A plurality of the single crystalline regions, formed and extended from the plurality of the apexes, is shown. Thereby, a large area of the film can be crystallized in a short period of time according to the second embodiment of the present invention. Consequently, according to this second embodiment, a plurality of pure single crystalline silicon regions is formed on the glass substrate in a reduced time without significant defects.

Figure 11:
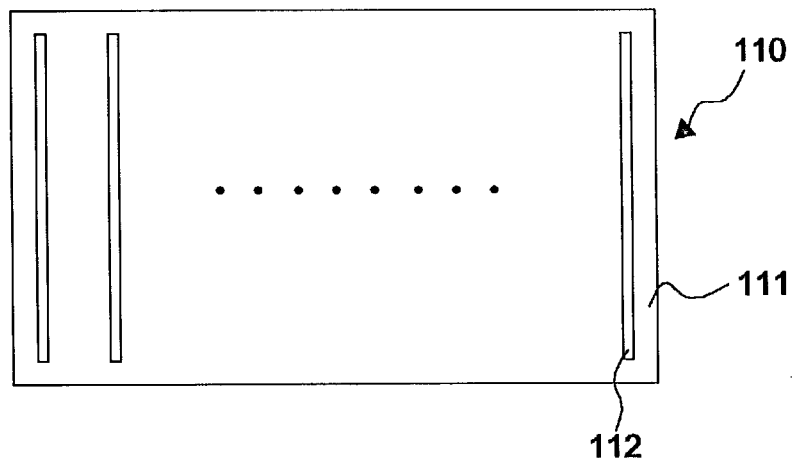
FIG. 11 is schematic drawing for illustrating a mask used in a third embodiment of the present invention.
Figure 12A:
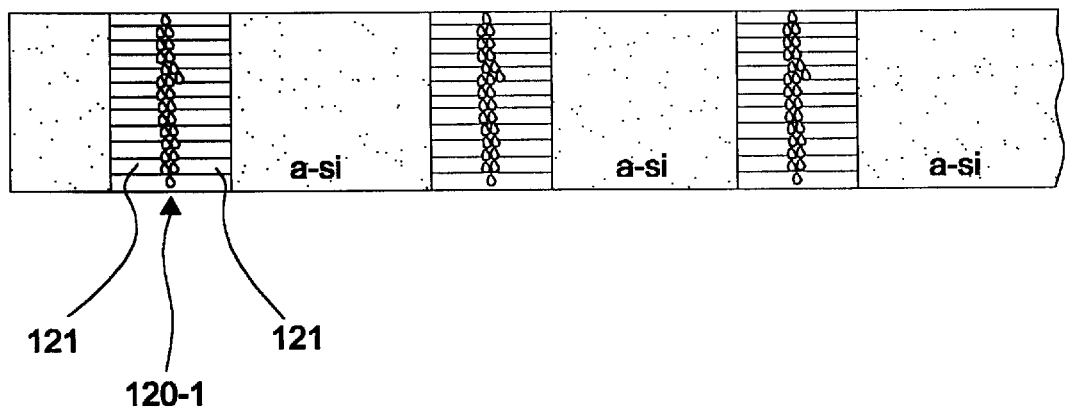
FIGS. 12A to 12C are schematic drawings showing a method for crystallizing a silicon layer according to the third embodiment of the present invention.
Figure 12B:
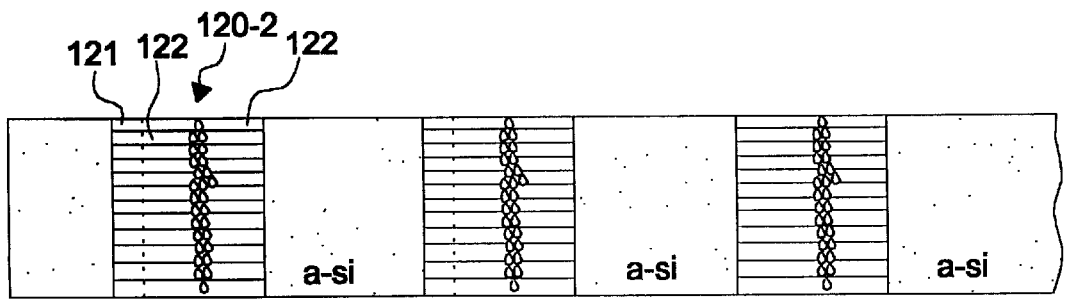
Figure 12C:
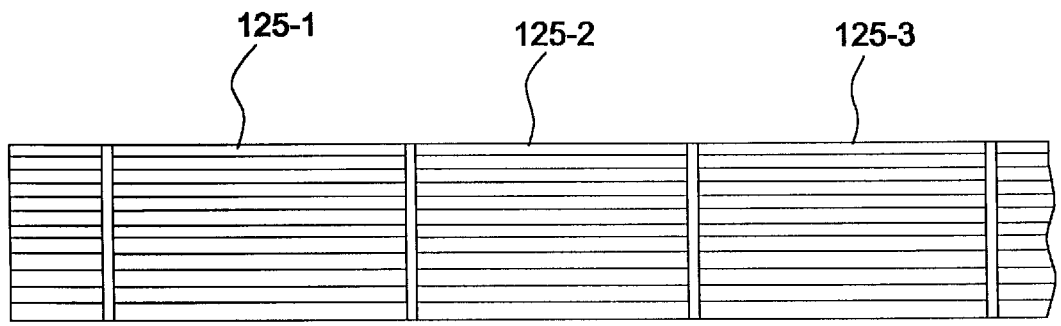

FIG. 11 and FIGS. 12A to 12C are schematic drawings showing a method for crystallizing a silicon film according to a third embodiment. FIG. 11 shows a mask forming a laser beam pattern and FIGS. 12A to 12C show a crystallization process with the laser beam patterned by the mask shown in FIG. 11. In sum, three laser beams patterned by three transparent slits onto an amorphous silicon film is shown in FIGS. 12A to 12C.

A plurality of transparent regions 112 having a long straight shape are arrayed at a predetermined distance in an opaque region substrate 111 of a mask 110 for patterning a laser beam. One laser beam is passed through the mask 110, having a plurality of transparent regions 112 to pattern a plurality of laser beams.

The size of the silicon grain formed by SLS technique is controlled by the distance of each transparent region 112 and the total number of the transparent regions 112 in the mask 110.

Referring to FIG. 12A, a plurality of the selected narrow regions having a straight slit shape of the film are first irradiated with a laser beam patterned by the mask shown in FIG. 11 at an energy density sufficient to induce complete melting. Subsequently, lateral grain growth proceeds from the unmelted regions of a-Si adjacent to the narrow strips which are fully-melted regions. The grain boundaries in directionally solidified materials are formed and are substantially perpendicular to the melted interface. Depending on the width of the molten region, lateral growth ceases when either (1) the two opposing growth fronts collide at the center, or (2) the molten region becomes sufficiently supercooled so that a bulk nucleation of solids occur—whichever occurs first. Due to such considerations, the maximum lateral growth distance that can be achieved with a single pulse is limited to less than certain length, depending on the film thickness and the incident energy density.

As shown in FIGS. 12A and 12B, a plurality of the polycrystalline regions 121 are formed by lateral grain growth and a plurality of the fine polycrystalline silicon regions 120-1 having bulk nucleation of solids are also formed.

Referring to FIG. 12B, the film is translated relative to the beam image over a distance less than the single-pulse lateral growth distance, and irradiated again. Lateral growth recommences from the edges of the completely molten region, one of which is located within the grains grown 121 during the previous, the first irradiation, step. The length of the grains is increased beyond the single-pulse lateral growth distance. Undefined 122 denotes a plurality of the polycrystalline region formed by the lateral grain growth and 120-2 denotes a plurality of the fine polycrystalline silicon regions having bulk nucleation of solids.

Referring to FIG. 12C, the above-cited process, irradiating and solidifying, can be repeated indefinitely, leading to grains of any desired length. The final microstructure obtained in this fashion is shown. A plurality of the grains having a predetermined length, such as the distance between one transparent region and an adjacent transparent region of the mask, are shown in FIG. 12C. Polycrystalline silicon regions 125-1, 125-2 and 125-3 crystallized by SLS, using a plurality of the laser beams are also shown in FIG. 12C.

Accordingly, the large area film is crystallized in short time according to the third embodiment of the present invention. The more the number of the laser beam is, the shorter the crystallization time. In other words, the crystallization speed by using an n laser beam is n-times faster than that by using only one laser beam. A plurality of the crystalline silicon regions is formed on the glass substrate in short time according to the third embodiment of the present invention.

Figure 13A:
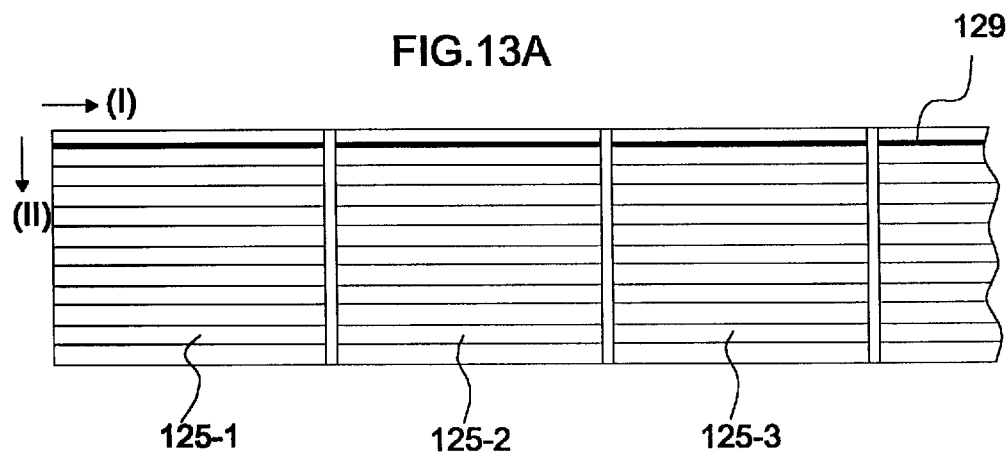
FIGS. 13A to 13C are another schematic drawings showing a method for crystallizing a silicon layer according to the fourth embodiment of the present invention.
Figure 13B:
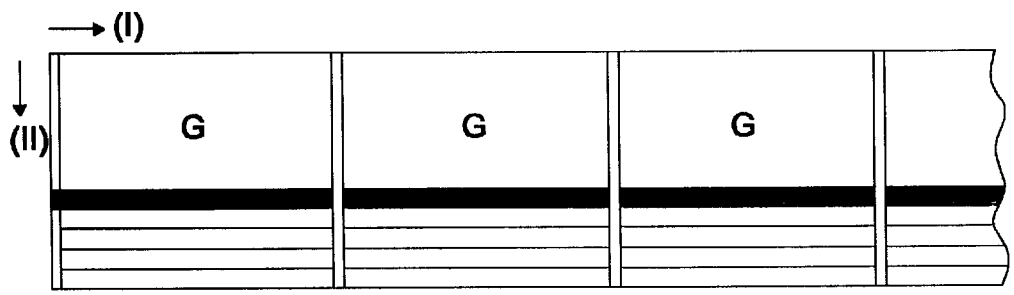
Figure 13C:
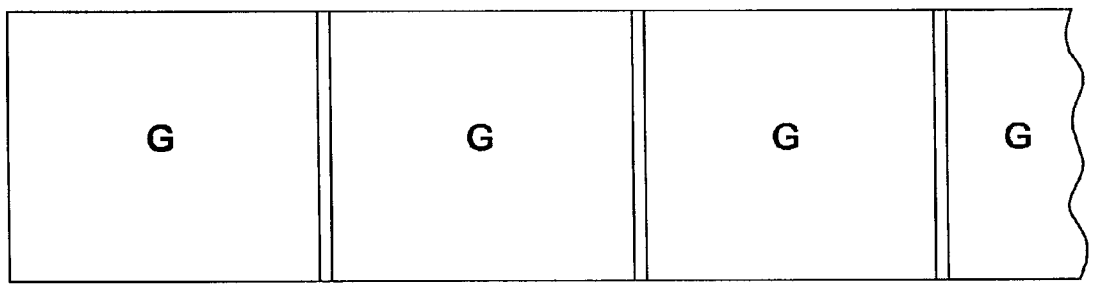

FIGS. 13A–13C are schematic drawings for explaining a method for crystallizing a silicon film according to a fourth embodiment of the present invention, in which the laser scanning for the lateral grain growth by SLS are performed two times, for example, once in a vertical direction and then a horizontal direction. The first laser scanning for lateral grain growth proceeds at a first direction to form a polycrystalline silicon region having first direction columnar grains and the second laser scanning for lateral grain growth proceeds at a second direction perpendicular to the first direction to form single crystalline regions by using one of the first direction columnar grains as seed for grain growth.

Referring to FIG. 13A, a plurality of the selected straight regions of the crystallized silicon film having first direction (I) columnar grains are irradiated with a plurality of the straight laser beams 129 having the second direction perpendicular to the first direction. The straight laser beams are prepared by rotating the mask which was used in the third embodiment of the present invention at the angle of about 90 degrees. Subsequently, the lateral grain growth proceeds to the second direction (II) from the unmelted regions adjacent to the narrow strips, fully-melted regions by using one of the first direction columnar grains as a seed for grain growth. The grain boundaries is directionally solidified materials tend to form so as to always be approximately perpendicular to the melted interface. As a result, polycrystalline silicon regions 125-1, 125-2 and 125-3 crystallized by the third embodiment of the present invention are formed.

Referring to FIG. 13B, the above-cited process, irradiating and solidifying, can be repeated indefinitely, leading to grains of any desired length. As the lateral grain growth to a second direction proceeds, the seed grain grows more and more. The translating direction of the laser beam relative to the film keeps the second direction (II).

Referring to FIG. 13C, a plurality of the seed grain grows dramatically to form a plurality of the single crystalline region G as a result of the crystallization. Accordingly, crystallized silicon film having very large size single crystalline regions could be formed on the glass substrate.

Figure 14:
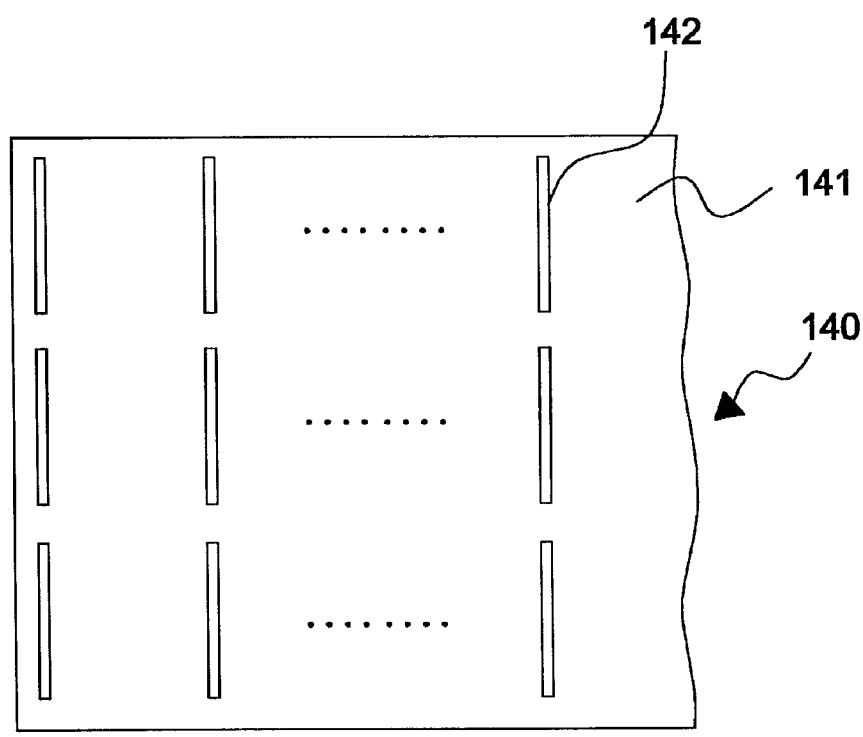
FIG. 14 is schematic drawing illustrating a mask used in a fifth embodiment of the present invention.
Figures 15A, 15B:
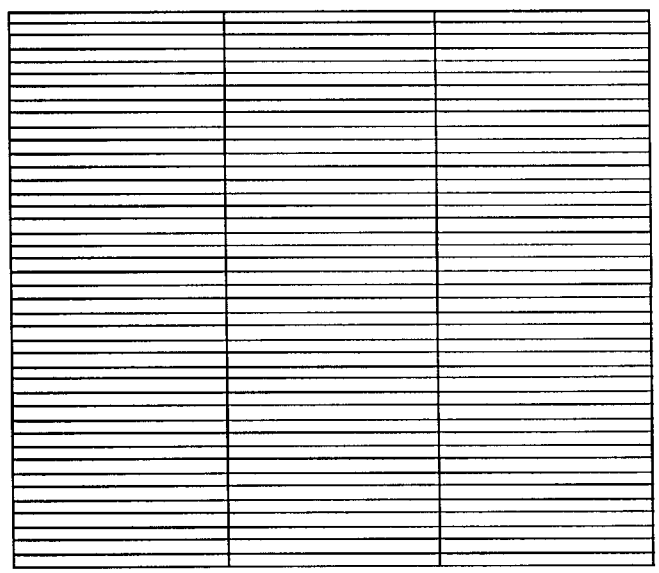
FIGS. 15A to 15B are drawings showing crystallization according to the fifth embodiment of the present invention.

FIG. 14 and FIG. 15A to FIG. 15B are schematic drawings for explaining a method for crystallizing a silicon film according to a fifth embodiment of the present invention. FIG. 14 shows a mask forming a laser beam pattern and FIG. 15A to FIG. 15B show a crystallized silicon film with laser beams patterned by the mask shown in FIG. 14.

A plurality of transparent regions or slits 142 having a long straight shape are arrayed in a row and in a column at a predetermined distance in opaque region substrate 141 of a mask 140 for patterning a laser beam.

The crystallized silicon film having a plurality of the single crystalline silicon regions arrayed in a row and in a column as shown in FIG. 15A to FIG. 15B is formed when the above cited process, irradiating and solidifying, is repeated indefinitely, leading to grains of any desired length as in the fourth embodiment of the present invention. The crystallized silicon film having a plurality of the columnar long grain as shown in FIG. 15A is formed by proceeding lateral grain growth at the first direction. The crystallized silicon film having a plurality of the single crystalline silicon region G as shown in FIG. 15B is formed by proceeding lateral grain growth at the first direction and at the second direction perpendicular to the first direction.

Figure 16:
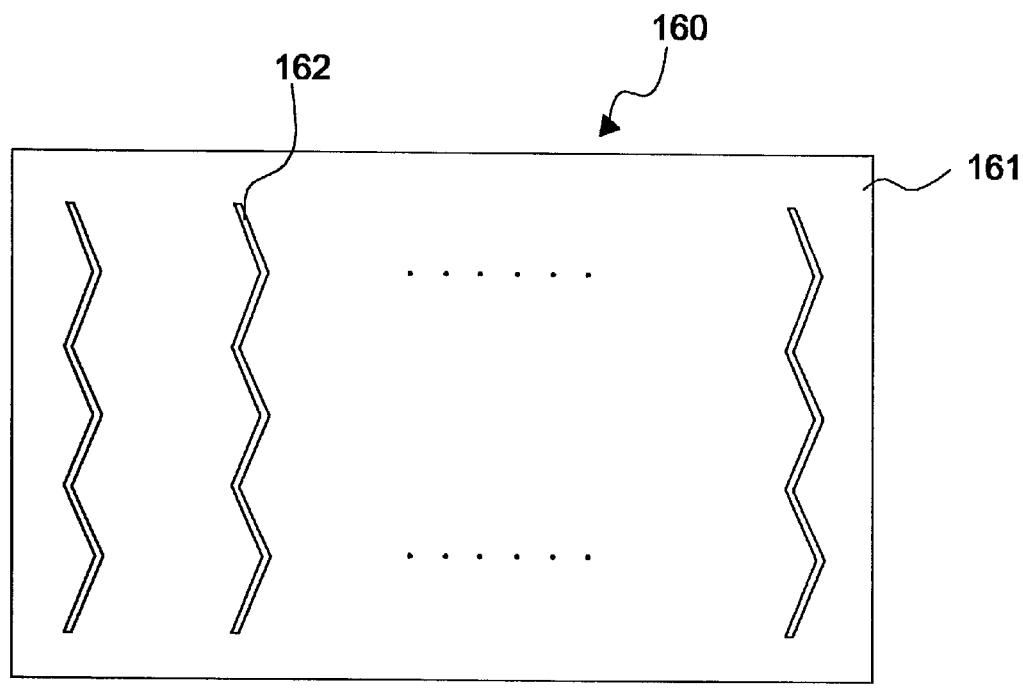
FIG. 16 is a schematic drawing showing another mask used in a sixth embodiment of the present invention.
Figure 17:
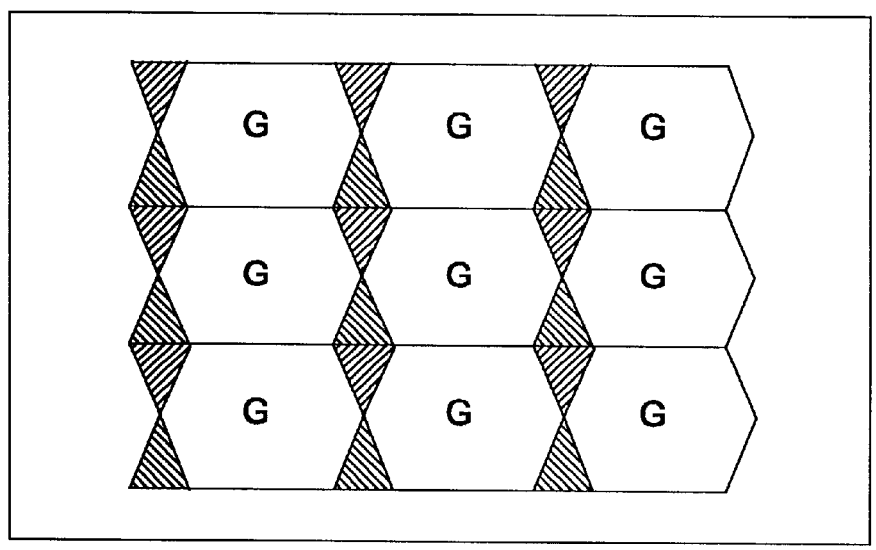
FIG. 17 is a schematic drawing showing a mask used in the sixth embodiment of the present invention.

FIGS. 16 and 17 are schematic drawings for explaining a method for crystallizing a silicon film according to a sixth embodiment of the present invention. FIG. 16 shows a mask for forming a laser beam pattern and FIG. 17 shows a crystallized silicon film with laser beams patterned by the mask shown in FIG. 16. The sixth embodiment of the present invention discloses the method for crystallizing the large area of a silicon film by SLS with a plurality of the laser beams having a continuous chevron-shape, the apexes of which are rounded as described in the second embodiment of the present invention.

A plurality of transparent regions 162 having a continuous chevron-shape of which the apexes are rounded as described in the second embodiment of the present invention are arrayed in a row or in a column at a predetermined distance in an opaque region substrate 161 of a mask 160 for patterning a laser beam. Accordingly, one laser beam is passed through the mask 160 having a plurality of transparent regions 162 to pattern a plurality of laser beams.

The crystallized silicon film having a plurality of the single crystalline silicon regions arrayed in a row or in a column as shown in FIG. 17 is formed when the above-cited process, irradiating and solidifying, is repeated, leading to grains of any desired length as in the second embodiment of the present invention.

The method for crystallizing the silicon film through SLS technique by using the laser beam having a continuous chevron-shape, the apexes of which are rounded, is described previously. A plurality of the single crystalline region, formed and extended from the plurality of the apexes, are shown. As a result, the large area film is crystallized in short time by using a plurality of the laser beams according to the third to sixth embodiments of the present invention to form a large size of the silicon grain or single crystalline silicon region.

As described, the number and the pattern of the laser beams are controlled by the condition of the pattern of the transparent regions of the mask. Accordingly, the number and the pattern of the laser beams may be chosen accordingly to different applications.

Figure 18A:
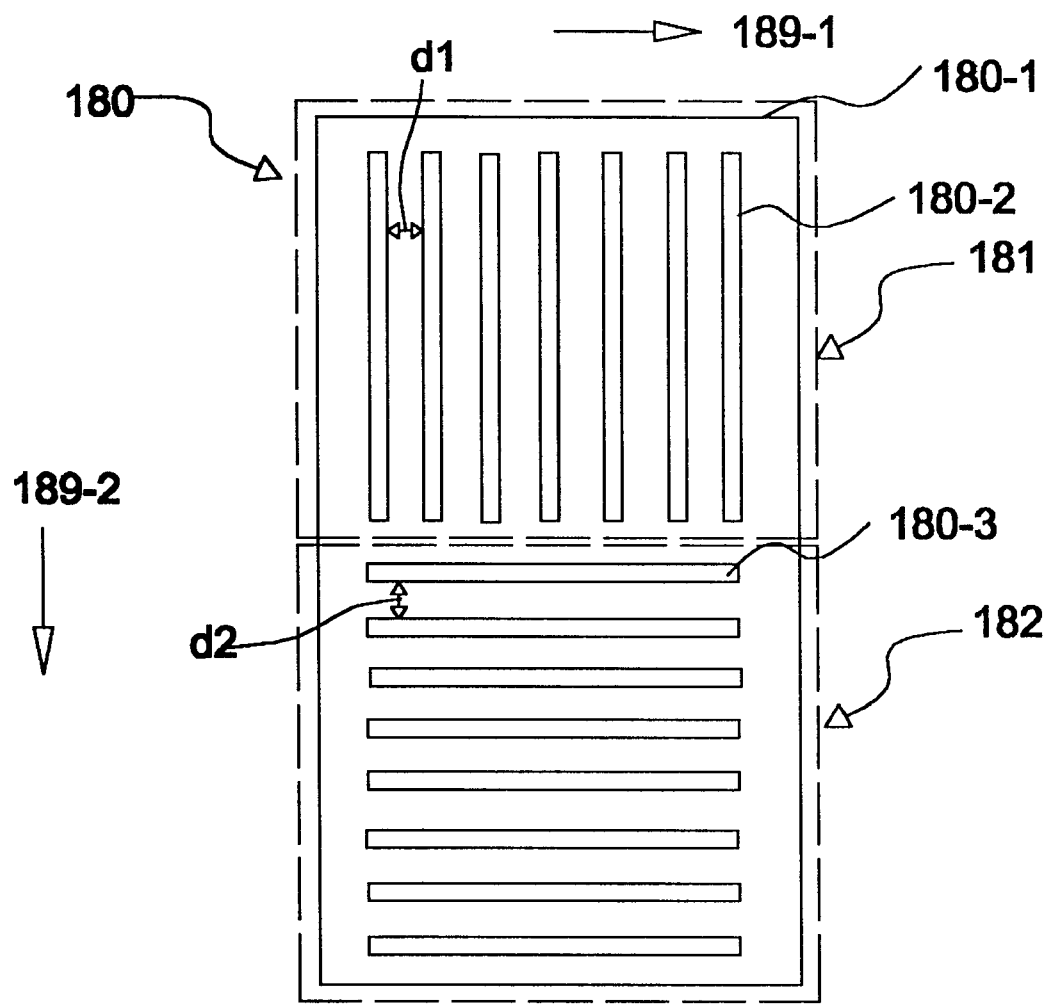
FIG. 18A shows one of the various examples for the mask for patterning a laser beam. according to a seventh embodiment of the present invention
Figure 18B:
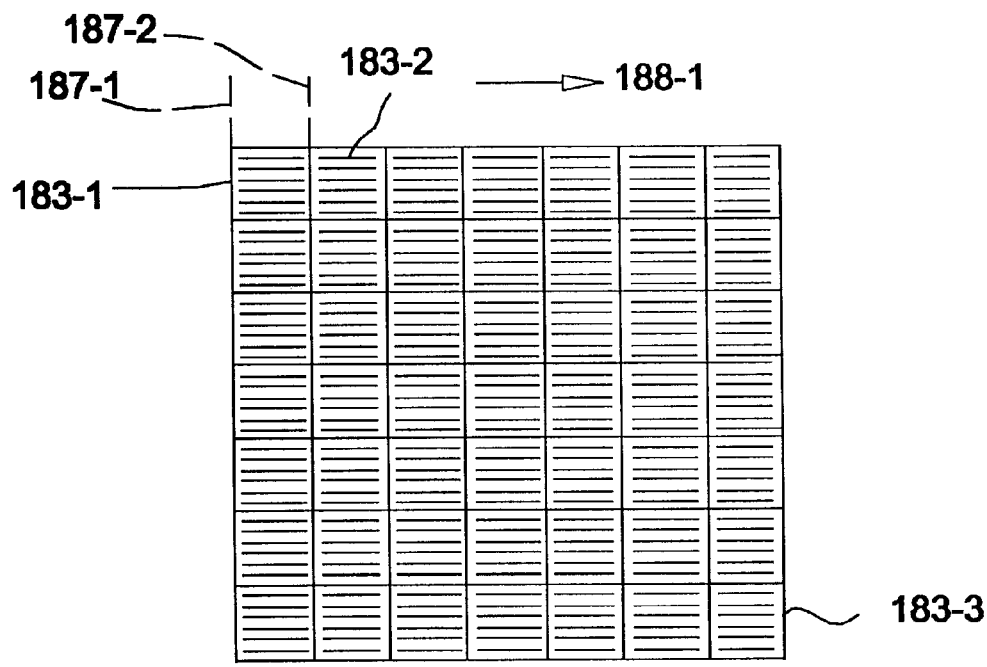
FIG. 18B to FIG. 18C are schematic drawings for explaining a method for crystallizing a silicon film using th mask as shown in FIG. 18A.
Figure 18C:
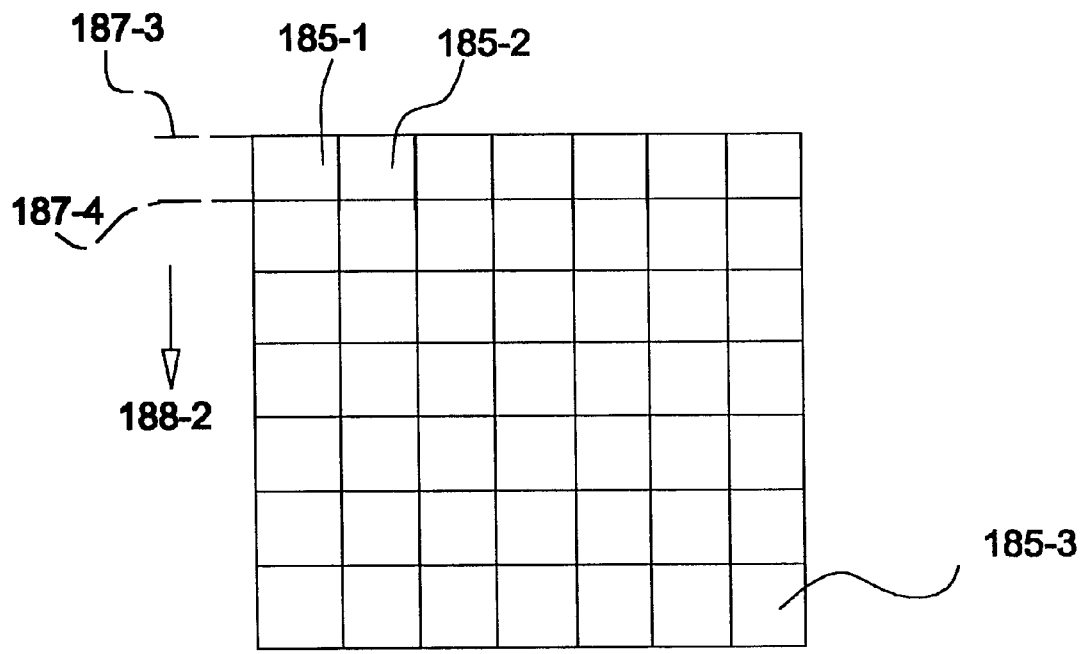

FIG. 18A shows one of the various examples for the mask for patterning a laser beam. according to the seventh embodiment of the present invention and FIG. 18B to FIG. 18C are schematic drawings for explaining a method for crystallizing a silicon film using the mask as shown in FIG. 18A.

The mask 180 has a first region 181 and a second region 182 in which a plurality of transparent regions are arrayed in opaque region substrate 180-1 for patterning a laser beam.

A plurality of long straight line shaped transparent regions 180-2 are arrayed in a first direction 189-1 at a first distance dl in the first region 181. A plurality of long horizontal line shaped transparent regions 180-3 are arrayed in a second direction 189-2 at a second distance d2 in the second region 182. The first direction 189-1 is nearly perpendicular to the second direction 189-2.

One laser beam is passed through the mask 180 to pattern a plurality of laser beams.

Referring to FIG. 18B, the first region 181 of the mask 180 is aligned at a first base line 187-1 of a silicon layer.

And then, one laser beam is passed through only the first region 181 of the mask 180 to be patterned to a plurality of long straight line shaped laser beams. And, the silicon layer is first crystallized by SLS using the mask by carrying out the cited process in the third embodiment as shown in FIGS. 12A to 12C in which irradiating and solidifying are repeated indefinitely.

The first SLS crystallization region 183-1 is formed by translating the silicon layer relative to the laser beams at a first distance d1 during proceeding the SLS process by more than two shots of the laser. Herein, the first arrow 188-1 shows a direction of moving the mask 180 and the laser beams relative to the silicon layer.

And then, the first region 181 of the mask 180 is aligned at a second base line 187-2 of the silicon layer. And, a second SLS crystallization region 183-2 is formed by carrying out the same process as is applied for forming the first SLS crystallization region These crystallization process is carried out repeatedly through the all substrate to form a plurality of the SLS crystallization regions.

The last SLS crystallization region 183-3 is shown in FIG. 18B.

Referring to FIG. 18C, the second region 182 of the mask 180 is aligned at a third base line 187-3 of the silicon layer.

And, one laser beam is passed through only the second region 182 of the mask 180 to be patterned to a plurality of long horizontal line shaped laser beams. And then, the SLS silicon layer is second crystallized by SLS using the mask 180 by carrying out the cited process in the fourth embodiment as shown in FIGS. 13A to 13C in which irradiating and solidifying are repeated indefinitely.

The first SLS single crystallization region 185-1 is formed by translating the SLS silicon layer relative to the laser beams at a second distance d2 during proceeding the SLS process by more than two shots of the laser. Herein, the second arrow 188-2 shows a direction of moving the mask 180 and the laser beams relative to the silicon layer.

And then, the second region 182 of the mask 180 is aligned at a fourth base line 187-4 of the silicon layer. And, a second SLS single crystallization region 185-2 is formed by carrying out the same process as is applied for forming the first SLS single crystallization region These crystallization process is carried out repeatedly through the all substrate to form a plurality of the SLS single crystallization regions.

The last SLS single crystallization region 185-3 is shown in FIG. 18C.

Figure 19:
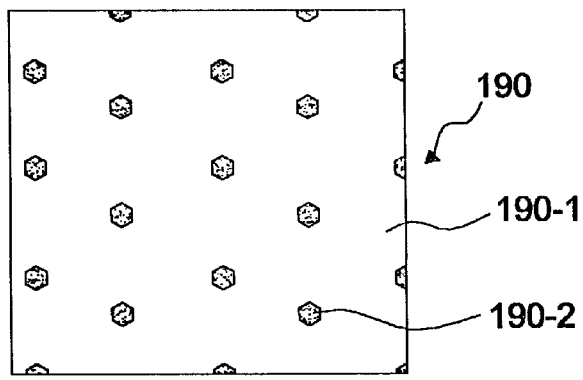
FIG. 19 is a schematic drawing showing a mask used in a eighth embodiment of the present invention.

FIG. 19 and FIGS. 20A to 20D are schematic drawings for explaining a method for crystallizing a silicon film according to an eighth embodiment of the present invention. FIG. 19 shows a mask forming a laser beam pattern and FIGS. 20A to 20D show a crystallization process with laser beams patterned by the mask shown in FIG. 19.

Figure 20A:
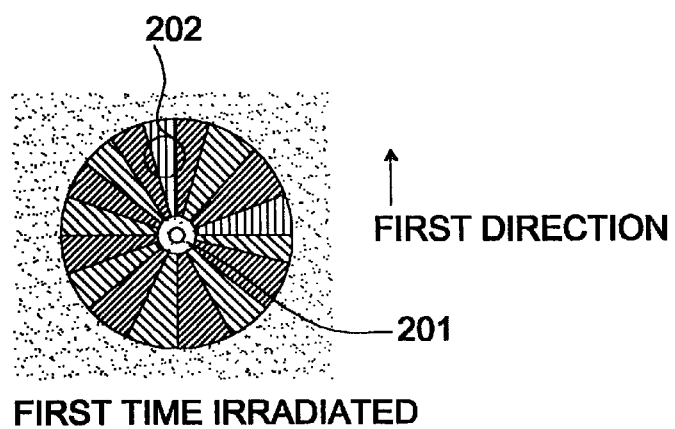
FIGS. 20A to 20D are schematic drawings showing a method for crystallizing a silicon layer according to the eighth embodiment of the present invention.

A plurality of opaque regions 190-2 having a plurality of the dot shape are arrayed at a predetermined distance in a transparent region substrate 190-1 of a mask 190 for patterning a laser beam. Herein, the shape of the dot may be a circle shape or a hexagon shape and the like. For convenience, the phenomenon that the film is crystallized by one laser beam is described. Referring to FIG. 20A, a portion except the selected dot region is first irradiated with a laser beam patterned by the mask shown in FIG. 19 at an energy density sufficient to induce complete melting.

The amorphous film is translated relative to the laser beam to the first direction over a distance less than a predetermined distance for second irradiating. While the film is translating, lateral grain growth proceeds from the unmelted regions, the dot region 201 which remains amorphous silicon adjacent to the fully-melted regions. The dot region 201, the unmelted amorphous silicon, is used as seeds and grows into the fully-melted regions. The grain boundaries in directionally solidified materials tend to form so as to always be approximately perpendicular to the melt interface. Reference number 202 denotes a dot region which will not be irradiated with second irradiating. Depending on the width of the molten region, lateral growth ceases when either (1) the two opposing growth fronts collide at the center, or (2) the molten region becomes sufficiently supercooled so that bulk nucleation of solids occur—whichever occurs first. Due to such considerations, the maximum lateral growth distance that can be achieved with a single pulse is limited to less than a certain length, depending on the film thickness and the incident energy density.

Figure 20B:
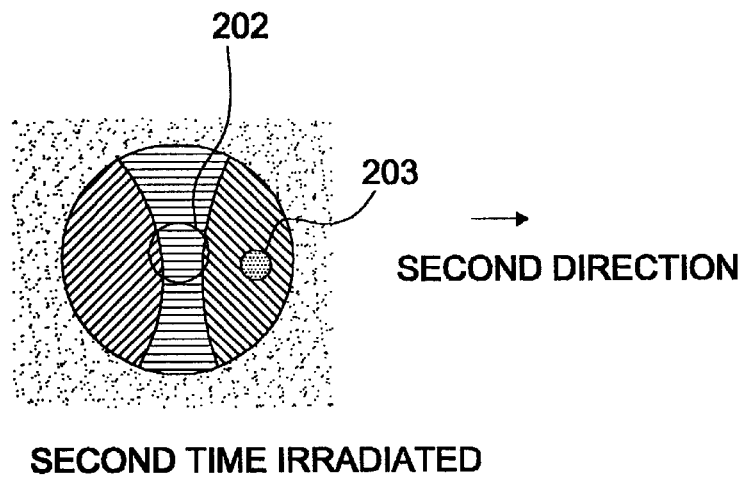

Referring to FIG. 20B, a portion except the selected dot region is irradiated for the second time at an energy density sufficient to induce complete melting. Herein the dot region is located in the crystallized silicon region. In this embodiment, the film is translated relative to the laser beam over a distance less than one pulse lateral grain growth.

The dot region which is not irradiated remains solid state of the polycrystalline silicon and has a limited number of silicon grains. In FIG. 20B, reference number 203 denotes a dot region which will not be irradiated with second irradiating.

The amorphous film is translated relative to the laser beam to the second direction over a distance less than predetermined distance for third irradiating. While the film is translating, lateral grain growth proceeds from the unmelted regions, dot region 202 which remains polycrystalline silicon adjacent to the fully-melted regions. The dot region 202, which is unmelted polycrystalline silicon having three grains, is used as a seed and grows into the fullymelted regions. The grain boundaries in directionally solidified materials tend to form substantially perpendicular to the melted interface. Reference number 203 denotes a dot region which will not be irradiated with a third irradiation.

Figure 20C:
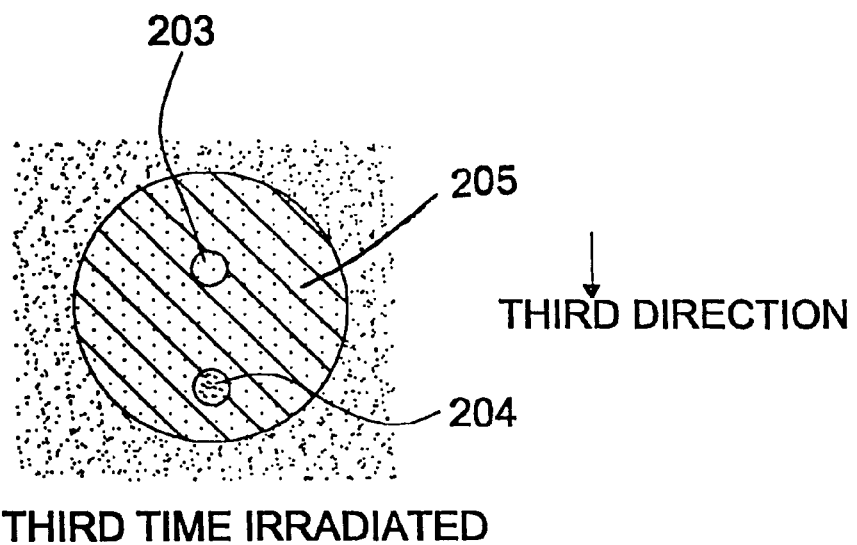

Referring to FIG. 20C, a portion except the selected dot region is irradiated at a third time at an energy density sufficient to induce complete melting. Herein the dot region is located in the crystallized silicon region. The film is translated relative to the laser beam over a distance less than one pulse lateral grain growth.

The dot region which is not irradiated remains solid state of the polycrystalline silicon and has a limited number of silicon grains than the previous step.

Accordingly, the more the above process carries out, the less the number of the grain is in dot region. Finally, the single grain remains in the dot region when the above processes carry out at an appropriate number.

The amorphous film is translated relative to the laser beam to a fourth direction over a distance less than predetermined distance for irradiating four. While the film is translating, lateral grain growth proceeds from the unmelted regions, dot region 203 in which the single crystalline grain remains adjacent to the fully-melted regions 205. The unmelted single crystalline silicon dot region 203 is used as a seed and grows into the fully-melted regions. The single grain grows laterally. Reference number 203 denotes a dot region which will not be irradiated during the third irradiation.

Figure 20D:
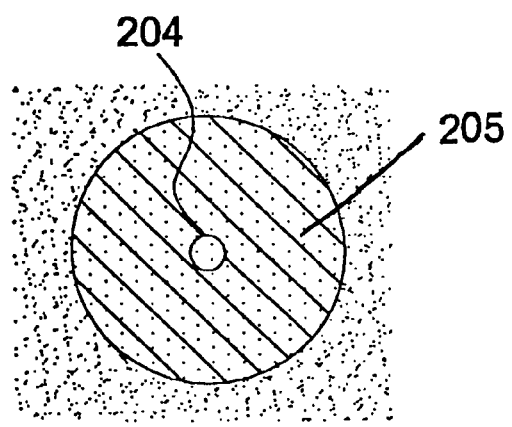

Referring to FIG. 20D, a portion except the selected dot region is third irradiated at an energy density sufficient to induce complete melting. Herein the dot region is located in the crystallized silicon region. The film is translated relative to the laser beam over a distance less than one pulse lateral grain growth. The dot region which is not irradiated remains solid state of the single crystalline silicon.

The film is translated relative to the laser beam to the next direction over a distance less than predetermined distance for next irradiating. While the film is translating, lateral grain growth proceeds from the unmelted regions which constitutes the dot region 204 in which the single crystalline grain remains adjacent to the fully-melted regions. The unmelted single crystalline silicon dot region 204 is used as a seed and grows into the fully-melted regions. The single grain grows laterally.

Accordingly, as the above process is repeatedly carried out, the number grains is reduced in dot region. Finally, the single grain remains in the dot region when the above process is sufficiently carried out.

The size of the single crystalline silicon region is the same as the lateral grain growth. The length of the lateral grain growth depends on the thickness of the film and the temperature of the film. Accordingly, the size of the single crystalline silicon region could be controlled according to the thickness and the temperature of the film.

In case the distance between the dot to the dot is larger than the length of the lateral grain growth, each of the large single crystalline silicon regions G is separated and fine crystalline silicon is shown.

In the above description, the case of the four irradiating and crystallization steps are described as embodiments of the present invention. However, depending on the process condition, the larger single crystalline silicon grain could be formed by using combination of one or more irradiating crystallization methods.

Figure 21:
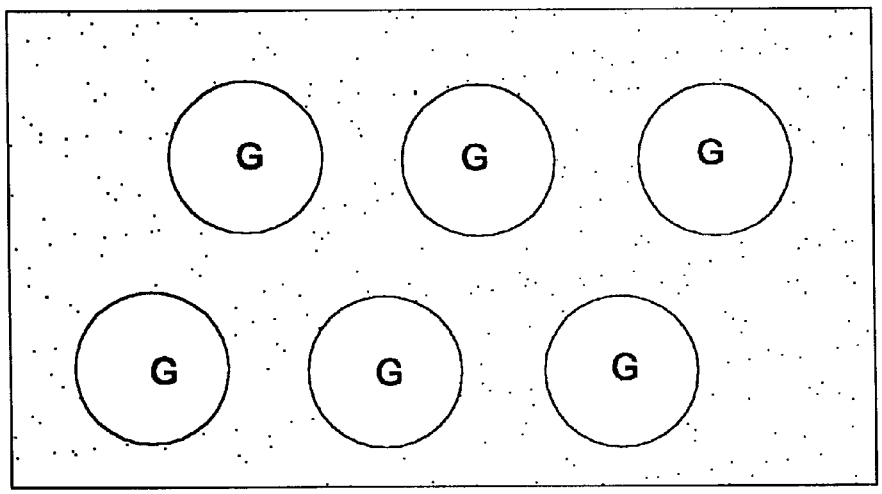
FIG. 21 is a drawing showing crystallization according to the ninth embodiment of the present invention.

FIG. 21 shows the crystallization result of the silicon film according to the ninth embodiment of the present invention.

In case the distance between the dot to the dot is larger than the length of the lateral grain growth, each of the large single crystalline silicon regions is separated and fine crystalline silicon is shown.

However, when the distance between the dots is smaller than the length of the lateral grain growth, the polycrystalline silicon film having a plurality of the single crystalline silicon region with grain boundary which is at the interface of the silicon grain and the silicon grain.

The shape and the location of the single crystalline silicon region is controlled by the array of the opaque regions of the mask. This is described referring to the following eighth and ninth embodiments of the present invention.

Figure 22:
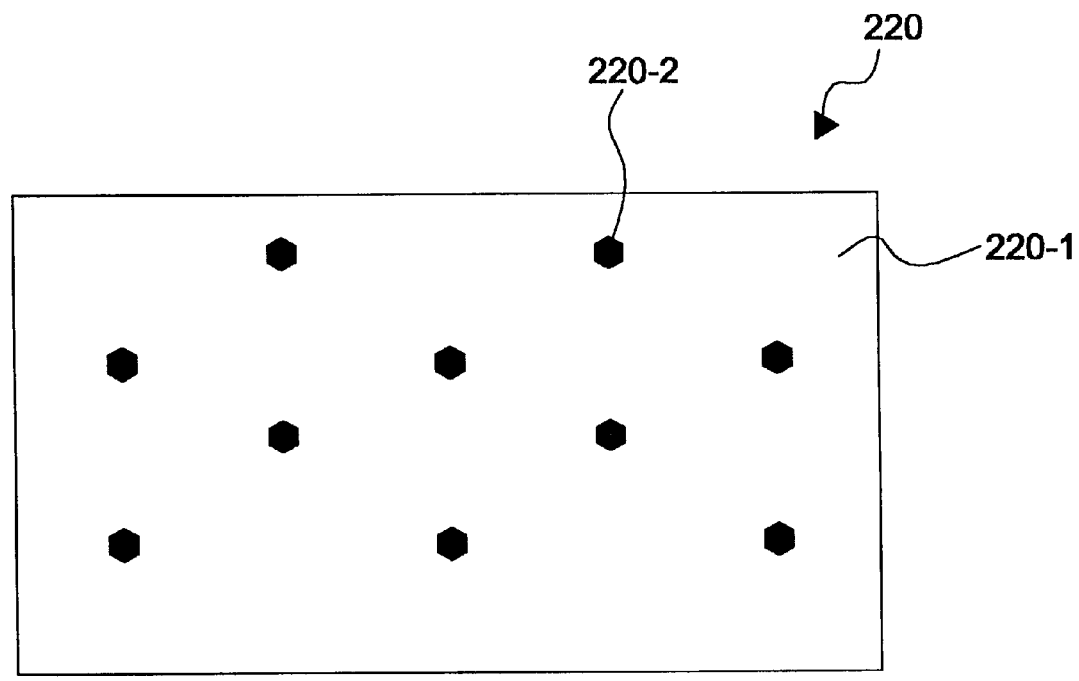
FIG. 22 is a schematic drawing illustrating a mask used in a tenth embodiment of the present invention.
Figure 23:
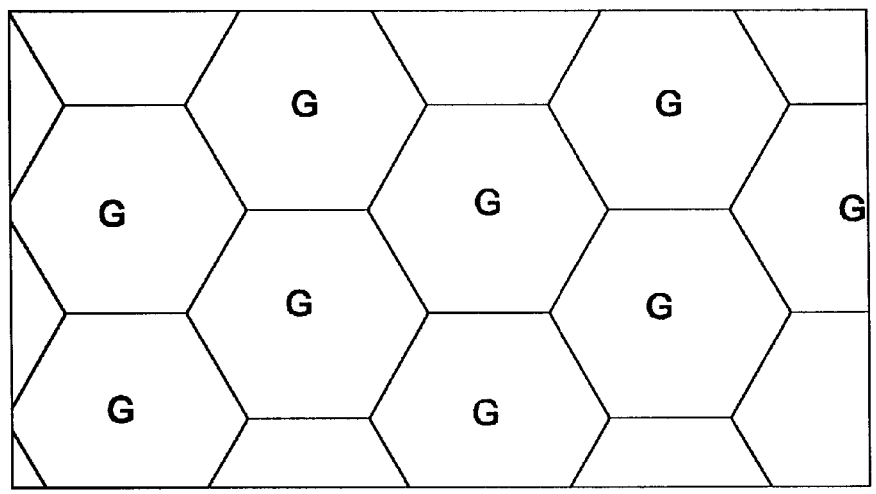
FIG. 23 is a drawing showing crystallization according to the tenth embodiment of the present invention.

FIGS. 22 and 23 are schematic drawings showing a method for crystallizing a silicon film according to a tenth embodiment of the present invention. FIG. 22 shows a mask forming a laser beam pattern and FIG. 23 shows a crystallization result with laser beam patterned by the mask shown in FIG. 22.

In this embodiment, a plurality of opaque regions 220-2 having a plurality of the dot shape are arrayed at a predetermined distance in a transparent region substrate 220-1 of a mask 220 for patterning a laser beam. The one dot is surrounded by the six dots. Herein, the shape of the dot is a circle shape or a hexagon shape and the like. The crystallized silicon film having a plurality of the hexagonal shaped single crystalline regions G arrayed is formed when the above cited process, irradiating and solidifying, is repeated indefinitely, leading to grains of any desired length as in the seventh embodiment of the present invention. The one lateral growing silicon grain collides to the other six lateral growing silicon grains.

Figure 24:
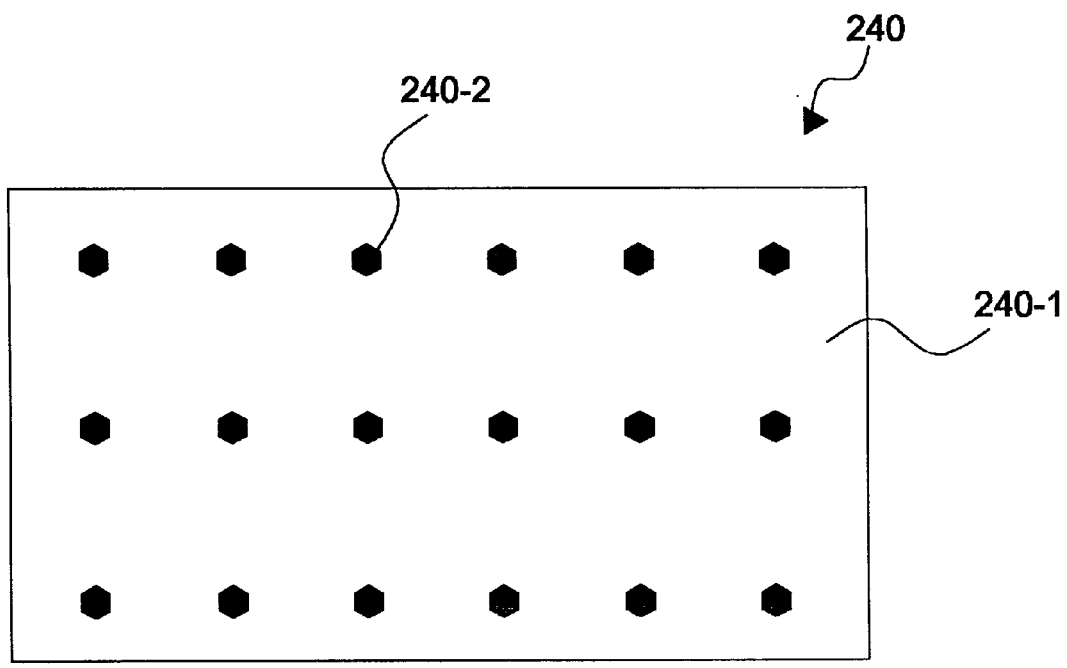
FIG. 24 is a schematic drawing showing a mask used in an eleventh embodiment of the present invention.
Figure 25:
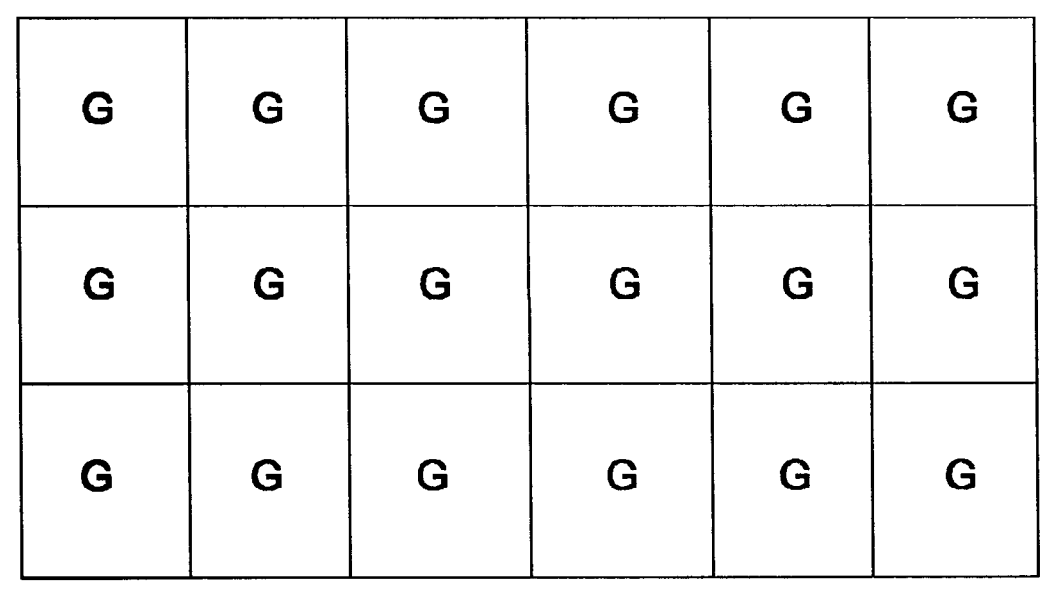

FIGS. 24 and 25 are schematic drawings for explaining a method for crystallizing a silicon film according to an eleventh embodiment of the present invention. FIG. 24 shows a mask forming a laser beam pattern and FIG. 25 shows a crystallization result with laser beam patterned by the mask shown in FIG. 24.

In this embodiment, a plurality of opaque regions 240-2 having a plurality of the dot shape are arrayed at a predetermined distance in a transparent region substrate 240-1 of a mask 240 for patterning a laser beam. The one dot is surrounded by the four dots. Herein, the shape of the dot is a circle shape or a hexagon shape and the like. The crystallized silicon film having a plurality of the square shaped single crystalline silicon regions G arrayed is formed when the above cited process, irradiating and solidifying, is repeated indefinitely, leading to grains of any desired length as in the seventh embodiment of the present invention. The one lateral growing silicon grain collides to the other four lateral growing silicon grains.

The higher the temperature of the film, the longer the solidification time. Accordingly, the length of the lateral grain growth is larger to form the larger single crystalline silicon region.

Accordingly, the shape and the size of the single crystalline silicon region is controlled by the array of the opaque regions of the mask, temperature of the film and the translating direction and the translating speed of the film relative to the laser beam.

When the distance between the opaque region to the opaque region of the mask is uniform, the size of the single crystalline silicon region is uniform, as in the eighth and ninth embodiment of the present invention.

FIGS. 26A to 26E are schematic drawings for explaining a method for fabricating a TFT according to an embodiment of the present invention. A co-planar-typed TFT having a pixel electrode is taken as an example.

Figure 26A:
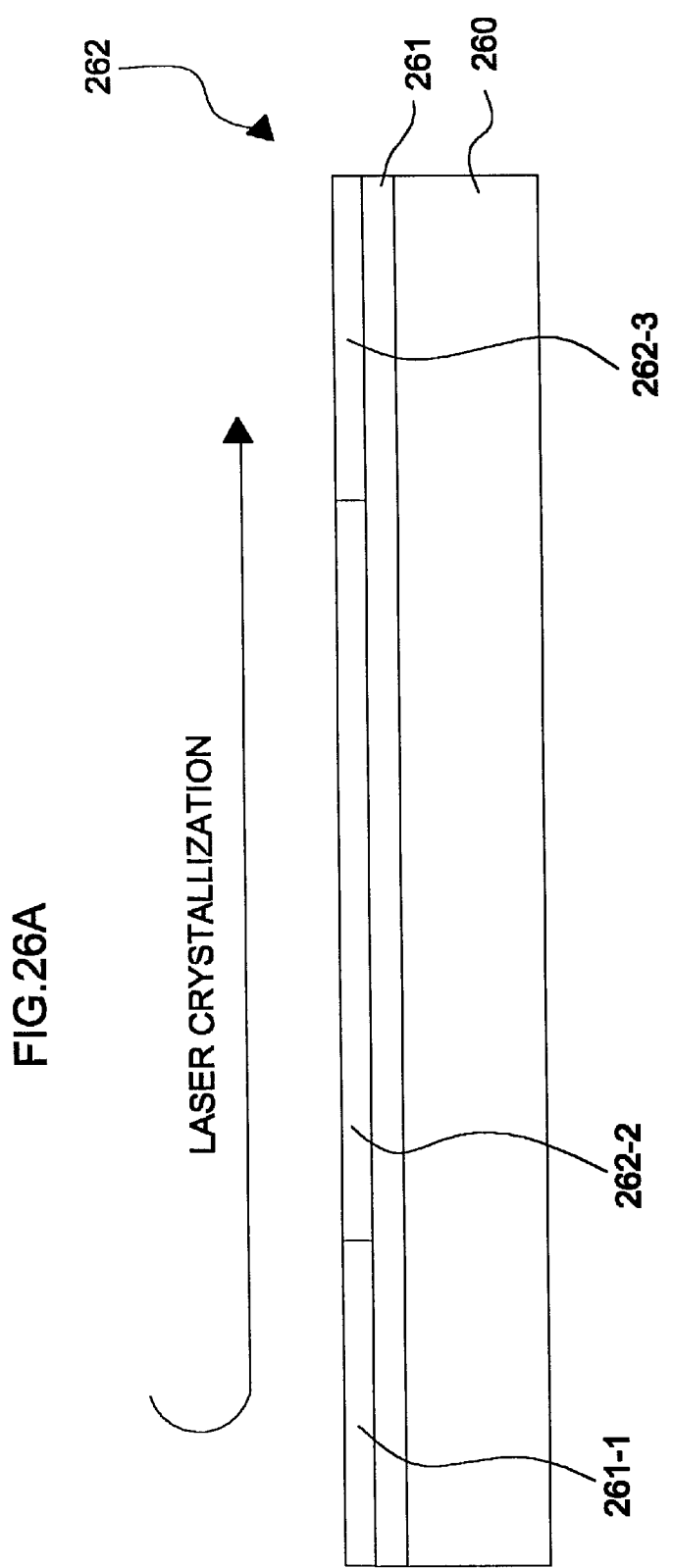

Referring to FIG. 26A, a buffer layer 261, such as a silicon oxide layer, is deposited on the insulating substrate 260, such as a glass substrate. An amorphous silicon layer is deposited on the buffer layer 261 and is crystallized by the SLS technique. Since the SLS technique is shown in the description of the first to ninth embodiments of the present invention, the description of the SLS technique will not be repeated. The buffer layer prevents the impurities of the insulating substrate to penetrate into the silicon thin film during the process of crystallization. A crystallized silicon thin film having a dramatically large first silicon grain 262-1, a second silicon grain 262-2 and a third silicon grain 263-3 are shown in FIG. 26A.

Referring to FIG. 26B, the crystallized silicon thin film is etched by photolithography to form an active layer 263. Since the first silicon grain, the second silicon grain and the third silicon grain are large, the active layer is formed of one single silicon grain. Accordingly, a single crystalline silicon TFT could be fabricated on the insulating substrate, such as a glass substrate.

Referring to FIG. 26C, a first insulating layer and a first conductive layer are subsequently formed on the exposed surface of the substrate comprising the active layer 263. The first conductive layer is etched by photolithography to form a gate electrode 265 and the first insulating layer is etched to form a gate insulating interlayer 264. Source and drain regions 263S and 263D are formed by doping impurities in the exposed portions of the active layer. The channel region 263c is located between the source and the drain regions.

Figure 26D:
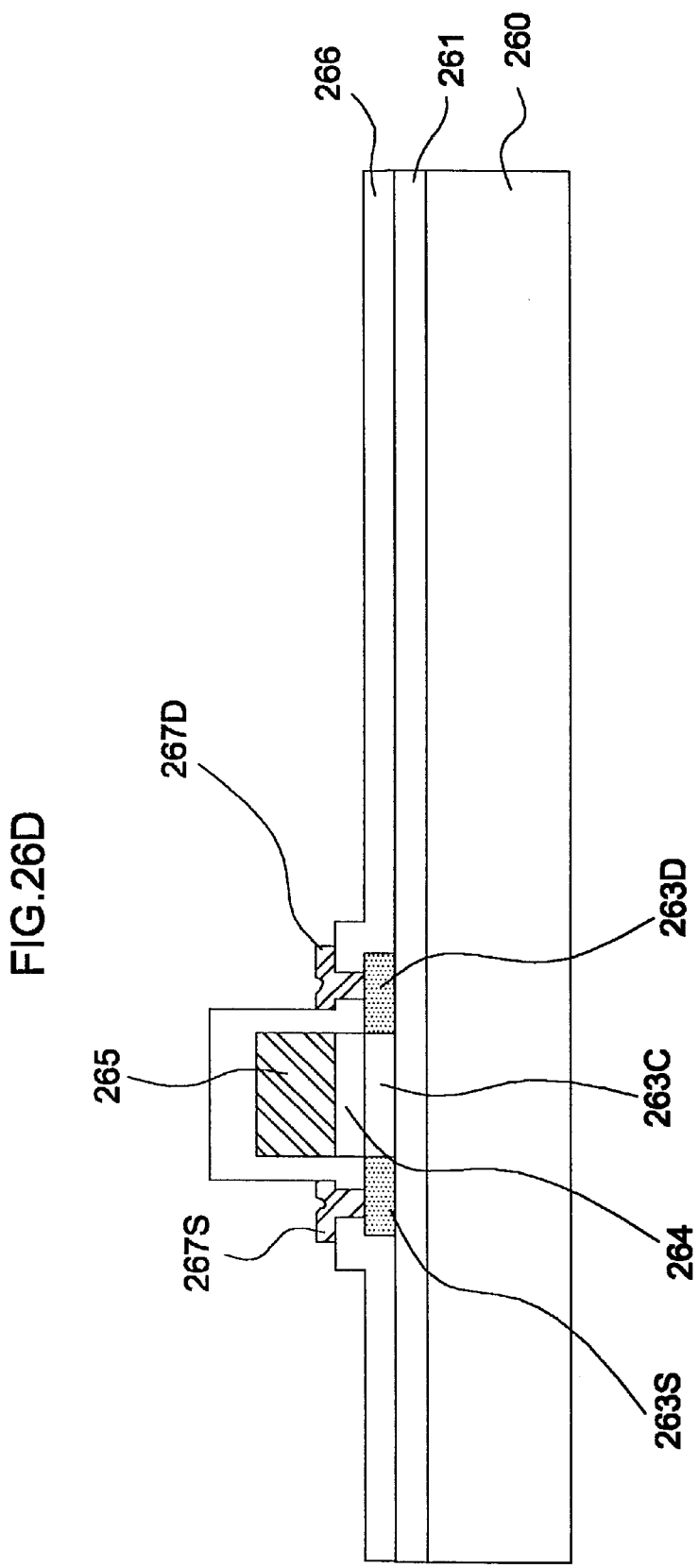
Figure 26E:
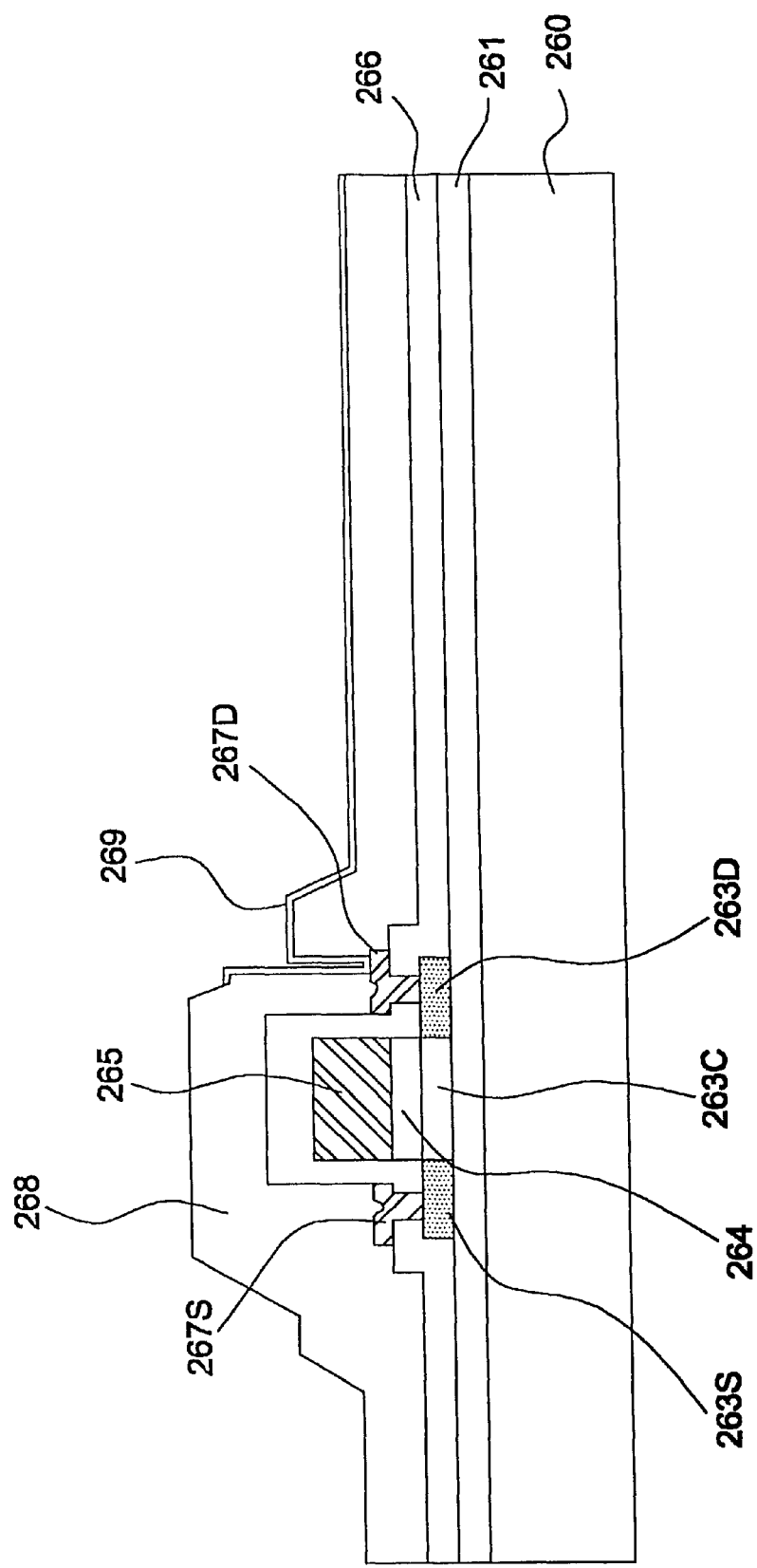

Referring to FIG. 26D, a second insulating layer 266 is deposited on the exposed surface of the substrate comprising the gate electrode. The second insulating layer is etched selectively by photolithography to expose the portions of the source and the drain regions. A second conductive layer is deposited on the exposed surface of the substrate and is etched selectively by photolithography to form source and drain electrodes 267S and 267D.

Referring to 26E, a third insulating layer 268 is deposited on the exposed surface of the substrate comprising the source and drain electrodes. The third insulating layer 268 is etched selectively by photolithography to expose the portion of the drain electrode 267D. And a transparent conductive layer is deposited on the exposed surface of the substrate and is etched selectively by photolithography to form a pixel electrode 269.

As described, a large single crystalline silicon region without defects could be formed in the insulating substrate by SLS technique with a laser beam having a chevron shape, the apex of which is round. And a large area silicon film is crystallized by SLS technique in short time by using a plurality of the laser beam.

The crystallized silicon film having a plurality of the large single crystalline silicon regions could be formed by proceeding lateral grain growth at the first direction to form a silicon film having a plurality of the columnar long grain and proceeding lateral grain growth at the second direction perpendicular to the first direction through using the columnar long grain as seed for grain growth.

The size, pattern and location of the single silicon grain are decided by controlling the pattern of the laser beam and the translation distance of the silicon layer relative to the laser beam.

The present invention enables one to fabricate a System-On-Panel (SOP) type LCD, in which a pixel part, a driver, a controller and a CPU circuit share the same substrate, whereby the fabrication process is simplified and the productivity is increased. Moreover, it is possible to fabricate portable LCD products, reduced in weight and size, since the space occupied by the controller and the CPU circuit is reduced.

It will be apparent to those skilled in the art that various modifications and variations can be made in a SOP-type liquid crystal display of the present invention without departing from the spirit or scope of the inventions. Thus, it is intended that the present invention will cover the modifications and variations of this invention provided they come within the scope of the appended claims and equivalents.

It will be apparent to those skilled in the art that various modifications and variations can be made in the method for crystallizing an amorphous silicon layer and the method for fabricating a thin film transistor using the same of the present invention without departing from the spirit or scope of the inventions. Thus, it is intended that the present invention covers the modifications and variations of the illustrated embodiments provided they come within the scope of the appended claims and equivalents.

What is claimed is:

1. A method for crystallizing an amorphous silicon layer disposed on a substrate, the method comprising the steps of:

preparing a first laser pattern comprising a plurality of chevron-shaped lines, wherein the chevron-shaped lines are aligned in a first direction;

first-irradiating the amorphous silicon layer with a laser beam at an energy density sufficient to induce substantially complete melting to form a melted region and an unmelted region;

solidifying the melted region of the amorphous silicon layer with a lateral grain growth from the unmelted region to the melted region;

translating the amorphous silicon layer relative to the first laser pattern over a first distance; and second-irradiating the amorphous silicon layer with the laser beams at an energy density sufficient to induce complete melting and crystallizing the irradiated portions of the amorphous silicon layer.

2. The method of claim 1, wherein the irradiating-solidifying-translating the amorphous silicon layer is performed at least two times.

3. The method of claim 1, further comprising the steps of preparing a second laser pattern comprising a plurality of chevron-shaped lines in a second direction perpendicular to the first direction of the first laser pattern and proceeding the irradiating-solidifying-translating of the amorphous silicon layer at least two times.

4. The method of claim 1, wherein the first and second laser patterns are prepared by emitting a laser beam through a mask, the mask having a plurality of transparent regions in an opaque substrate.

5. The method of claim 1, wherein each one of the chevron-shaped lines has a curved apex.

6. A method for crystallizing an amorphous silicon layer, the method comprising the steps of:

preparing an amorphous silicon layer to be crystallized on a substrate;

preparing a plurality of the laser beams arrayed predetermined distance between the laser beam to the laser beam, each the laser beam having a continuous chevron-shapes with rounded apexes;

first-irradiating a plurality of the selected portions of the amorphous silicon layer with the laser beams at an energy density sufficient to induce substantially complete melting to form a melted region and an unmelted region;

solidifying the melted region of the amorphous silicon layer with a lateral grain growth from the unmelted region to the melted region;

translating the amorphous layer relative to the beam image over a first distance to a second direction; and second-irradiating a plurality of the selected portions of the amorphous silicon layer with the laser beams at an energy density sufficient to induce complete melting and crystallizing the irradiated portions of the amorphous silicon layer.

7. A method for crystallizing an amorphous silicon layer disposed on a substrate, the method comprising the steps of:

irradiating the amorphous silicon layer with an energy source at an energy density sufficient to induce substantially complete melting to form a melted region and an unmelted region, wherein the energy source has a first pattern comprising a plurality of slits arranged adjacent to each other and separated by a predetermined distance at a first direction;

solidifying the melted region of the amorphous silicon layer with a lateral grain growth from the unmelted region to the melted region;

translating the amorphous silicon layer relative to the energy source over a first distance, wherein the translation of the energy source overlaps the melted region of the amorphous silicon layer; and irradiating the amorphous silicon layer with the laser beams at an energy density sufficient to induce complete melting and crystallizing the irradiated portions of the amorphous silicon layer.

8. The method of claim 7, wherein the energy source has a second pattern comprising a plurality of slits arranged adjacent to each other and separated by a predetermined distance at a second direction.

9. The method of claim 7, wherein the energy source is prepared by emitting a laser beam through a mask, the mask having a plurality of transparent regions.

10. The method of claim 8, wherein the energy source is prepared by emitting a laser beam through a mask, the mask having a plurality of transparent regions.

11. The method of claim 7, wherein each one of the plurality of slits of the first pattern includes chevron-shaped lines with curved apexes.

12. The method of claim 7, wherein each one of the plurality of slits of the first pattern defines a rectangular aperture.

13. The method of claim 8, wherein each one of the plurality of slits of the second pattern includes chevron-shaped lines with curved apexes.

14. The method of claim 8, wherein each one of the plurality of slits of the second pattern defines a rectangular aperture.

15. The method of claim 7, further comprising the steps of rotating the energy source with respect to the amorphous silicon layer so that first pattern is arranged in a second direction which is substantially perpendicular to the first direction.

16. The method of claim 15, wherein the energy source is prepared by emitting a laser beam through a mask and the rotating the energy source comprises rotating the mask.

17. The method of claim 15, wherein the energy source has a second pattern comprising a plurality of slits arranged adjacent to each other and separated by a predetermined distance at a second direction.

18. The method of claim 15, wherein each one of the plurality of slits of the first pattern includes chevron-shaped lines with curved apexes.

19. The method of claim 15, wherein each one of the plurality of slits of the first pattern defines a rectangular aperture.

20. The method of claim 15, wherein each one of the plurality of slits of the first pattern defines a rectangular aperture.

21. The method of claim 17, wherein each one of the plurality of slits of the second pattern includes chevron-shaped lines with curved apexes.

22. The method of claim 21, wherein each one of the plurality of slits of the second pattern defines a rectangular aperture.

23. A TFT manufactured according to the process of claim 7.

* * * * *